US009842721B2

United States Patent
Wong et al.

(10) Patent No.: US 9,842,721 B2
(45) Date of Patent: Dec. 12, 2017

(54) SYSTEMS AND METHODS FOR PARTICLE PULSE MODULATION

(71) Applicants: Liang Jie Wong, Cambridge, MA (US); Byron Freelon, Chicago, IL (US); Timm Rohwer, Arlington, MA (US); Nuh Gedik, Watertown, MA (US); Steven Glenn Johnson, Arlington, MA (US)

(72) Inventors: Liang Jie Wong, Cambridge, MA (US); Byron Freelon, Chicago, IL (US); Timm Rohwer, Arlington, MA (US); Nuh Gedik, Watertown, MA (US); Steven Glenn Johnson, Arlington, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 15/244,569

(22) Filed: Aug. 23, 2016

(65) Prior Publication Data
US 2016/0372300 A1    Dec. 22, 2016

Related U.S. Application Data

(63) Continuation of application No. 14/832,056, filed on Aug. 21, 2015, now Pat. No. 9,536,698.
(Continued)

(51) Int. Cl.
*H01J 37/00* (2006.01)
*H01J 37/06* (2006.01)

(52) U.S. Cl.
CPC ......... *H01J 37/06* (2013.01); *H01J 2237/047* (2013.01); *H01J 2237/0473* (2013.01); *H01J 2237/0475* (2013.01); *H01J 2237/063* (2013.01)

(58) Field of Classification Search
CPC ................. H01J 37/06; H01J 2237/047; H01J 2237/0473; H01J 2237/0475; H01J 2237/063
(Continued)

(56) References Cited

U.S. PATENT DOCUMENTS

| 2004/0233944 | A1 | 11/2004 | Dantus et al. |
| 2010/0187208 | A1 | 7/2010 | Dantus et al. |
| 2012/0327963 | A1 | 12/2012 | Hubbard et al. |

FOREIGN PATENT DOCUMENTS

| KR | 10-2011-0106885 A | 9/2011 |
| WO | WO 2010/070648 A1 | 6/2010 |
| WO | WO 2013/114351 A2 | 8/2013 |

OTHER PUBLICATIONS

P. Emma et al., "First lasing and operation of an angstrom-wavelength free-electron laser," Nat. Photon. 4, 641-7 (2010).
(Continued)

*Primary Examiner* — Nicole Ippolito
*Assistant Examiner* — Hanway Chang
(74) *Attorney, Agent, or Firm* — Cooley LLP

(57) ABSTRACT

Methods and apparatus for modulating a particle pulse include a succession of Hermite-Gaussian optical modes that effectively construct a three-dimensional optical trap in the particle pulse's rest frame. Optical incidence angles between the propagation of the particle pulse and the optical pulse are tuned for improved compression. Particles pulses that can be modulated by these methods and apparatus include charged particles and particles with non-zero polarizability in the Rayleigh regime. Exact solutions to Maxwell's equations for
(Continued)

first-order Hermite-Gaussian beams demonstrate single-electron pulse compression factors of more than 100 in both longitudinal and transverse dimensions. The methods and apparatus are useful in ultrafast electron imaging for both single- and multi-electron pulse compression, and as a means of circumventing temporal distortions in magnetic lenses when focusing ultra-short electron pulses.

27 Claims, 26 Drawing Sheets

Related U.S. Application Data

(60) Provisional application No. 62/040,464, filed on Aug. 22, 2014.
(58) Field of Classification Search
USPC .............. 250/251, 396 R, 398, 400, 396 ML
See application file for complete search history.

(56) References Cited

OTHER PUBLICATIONS

A. P. Mancuso et al., "Coherent imaging of biological samples with femtosecond pulses at the free-electron laser Flash," New J. Phys. 12, 035003 (2010).
J. R. Dwyer et al., Femtosecond electron diffraction: making the molecular movie, Phil. Trans. R. Soc. A 364, 741-78 (2006).
F. Carbone, P. Musumeci, O. J. Luiten, and C. Hebert, "A perspective on novel sources of ultrashort electron and X-ray pulses," Chem. Phys. 392, 1-9 (2012).
Y. Wang and N. Gedik, "Electron pulse compression with a practical reflectron design for ultrafast electron diffraction," IEEE J. Sel. Top. Quant. 18, 140-7 (2012).
M. Gao, H. Jean-Ruel, R. R. Cooney, J. Stampe, M. de Jong, M. Harb, et al., "Full characterization of RF compressed femtosecond electron pulses using ponderomotive scattering." Opt Express 20, 12048-58 (2012).
A. Gliserin, A. Apolonski, F. Krausz, and P. Baum, "Compression of single-electron pulses with a microwave cavity," New J. Phys. 14, 073055 (2012).
G. H. Kassier, N. Erasmus, K. Haupt, I. Doshoff, R. Siegmund, S. M. M. Coelho, et al., "Phototriggered pulsed cavity compressor for bright electron bunches in ultrafast electron diffraction," Appl Phys B 109, 249-57 (2012).
T. van Oudheusden, P. L. E. tl Pasmans, S. Il. van der Geer, 11 J. de Loos, VI. J. van der Wiel, and O. J. Luiten, "Compression of subrelativistic space-charge-dominated electron bunches for single-shot femtosecond electron diffraction," http://arxiv.org/abs/1006.2041 (Jun. 10, 2010).
P. Baum and A. H. Zewailt "Attosecond electron pulses for 4D diffraction and microscopy," P. Natl. Acad. Sci. USA. 104, 18409-14 (2007).
S. A. Hilbert, C. Uiterwaal, B. Barwick, H. Batelaan, and A. H. Zewaili "Temporal lenses for attosecond and femtosecond electron pulses," P. Natl. Acad. Sci. USA. 106, 10558-63 (2009).
M. Aidelsburger, F. O. Kirchner, F. Krausz, and P. Baum, "Single-electron pulses for ultrafast diffraction," P. Natl. Acad. Sci. USA 107, 19714-9 (2010).
A. H. Zewail, "Four-dimensional electron microscopy" Science 328, 187-93 (2010).
L. Veisz, G. Kurkin, K.Chernov, V. Tarnetsky, A. Apolonski, F. Krausz, and E. Fill, "Hybrid DC-AC electron gun for fs-electron pulse generation," New J. Phys. 9, 56694 (2007).
L. Novotny, E. J. Sanchez, and X. Sunney Xie, "Near-field optical imaging using metal tips illuminated by higher-order Hermite-Gaussian beams," Ultramicroscopy 71, 21-9 (1998).

S.-C. Chu, Y.-T. Chen, K.-F. Tsai, and K. Otsuka, "Generation of high-order Hermite-Gaussian modes in end-pumped solid-state lasers for square vortex array laser beam generation," Opt. Express 20, 7128-41 (2012).
A. Ashkin, "Optical trapping and manipulation of neutral particles using lasers," P. Xatl. Acad. Sci. USA 94, 4853-4860 (1997).
I. Y. Dodin and N.J. Fisch, "Particle manipulation with nonadiabatic ponderomotive forces," Phys. Plasmas 14, 055901 (2007).
E. Esarey, P. Sprangle, M. Pilloff, and J. Krall, "Theory and group velocity of ultrashort, tightly focused laser pulses," J. Opt. Soc. Am. B 12, 1695-1703 (1995).
O. Steuernagel, "Optical lenses for atomic beams," http://arxiv.org/abs/0810.4486 (Jan. 14, 2009).
C. J. R. Sheppard, "Polarization of almost-plane waves," J. Opt. Soc. Am. A 17, 335-341 (2000).
A. April, "Ultrashort, strongly focused laser pulses in free space," in Coherence and Ultrashort Pulse Laser Emission, F. J. Duarte, ed. (InTech , 2010), pp. 355-382.
L. J. Wong, F. X. Kartner, and S. G. Johnson, "Improved beam waist formula for ultrashort, tightly focused linearly, radially, and azimuthally polarized laser pulses in free space," ArXiV, https://arxiv.org/abs/1311.5788 (Nov. 22, 2013).
L. J. Wong, F. X. Kartner, and S. G. Johnson, "Improved beam waist formula for ultrashort, tightly focused linearly, radially, and azimuthally polarized laser pulses in free space," Opt. Lett. 39, 1258-1261 (Mar. 1, 2014).
P. Baum, "On the physics of ultrashort single-electron pulses for time-resolved microscopy and diffraction," Chem. Phys. 423, 55-61 (Sep. 23, 2013).
Zhang et al., "Tilted femtosecond pulses for velocity matching in gas-phase ultrafast electron diffraction," New Journal of Physics 16, Aug. 4, 2014, 12 pages.
Hilbert et al., "Temporal lenses for attosecond and femtosecond electron pulses," Department of Physics and Astronomy, University of Nebraska-Lincoln, PNAS, vol. 106 No. 26, Jun. 30, 2009, pp. 10558-10563.
Wong et al., "All-optical three-dimensional electron pulse compression," New Journal of Physics vol. 17 (Jan. 27, 2015), 13 pages.
A. H. Zewail, "4D Utrafast Electron Diffraction, Crystallography, and Microscopy," Annu. Rev. Phys. Chem. 57, 65-103 (2006).
G. Sciaini and R. J. D. Miller, "Femtosecond electron diffraction: heralding the era of atomically resolved dynamics," Rep. Prog. Phys. 74, 096101 (2011).
R. P. Chatelain, V. R. Morrison, C. Godbout, and B. J. Siwick, "Ultrafast electron diffraction with radio-frequency compressed electron pulses," Appl. Phys. Lett. 101, 081901 (2012).
C. Weninger and P. Baum, "Temporal distortions in magnetic lenses," Ultramicroscopy 113, 145-51 (2012).
H. A. H. Boot and R. B. R.-S.-Harvie, "Charged particles in a non-uniform radio-frequency field," Nature 180, 1187 (1957).
J. H. Eberly, J. Javanainen, and K. Rzazewski, "Above-threshold ionization," Phys. Rep. 204, 331-83 (1991).
Y. Harada and T. Asakura, "Radiation forces on a dielectric sphere in the Rayleigh scattering regime," Opt. Communications 124, 529-541 (1996).
A. April, "Nonparaxial elegant Laguerre-Gaussian beams," Opt. Lett. 33, 1392-1394 (2008).
L. Robson, P. T. Simpson, R. J. Clarke, K. W. D. Ledingham, F. Lindau, O. Lundh et. al, "Scaling of proton acceleration driven by petawatt-laser-plasma interactions," Nat. Phys. 3, 58-62 (2007).
U. Eichmann, T. Nubbemeyer, H. Rottke, and W. Sandner, "Acceleration of neutral atoms in strong short-pulse laser fields," Nature 461, 1261-1264 (2009).
J. C. H. Spence, W. Qian and M.P. Silverman, "Electron source brightness and degeneracy from Fresnel fringes in field emission point projection microscopy," J. Vac. Sci. Technol. A 12, 542-547 (1994).
Written Opinion of the International Searching Authority in related PCT Application No. PCT/US2015/046358, filed Aug. 21, 2015, dated Nov. 26, 2015, 5 pages.

SYSTEMS AND METHODS FOR PARTICLE PULSE MODULATION

CROSS-REFERENCES TO RELATED APPLICATIONS

This application is a continuation of U.S. application Ser. No. 14/832,056, which was filed on Aug. 21, 2015, is entitled "SYSTEMS AND METHODS FOR PARTICLE PULSE MODULATION," and claims the benefit of U.S. Application No. 62/040,464, filed Aug. 22, 2014, entitled "ALL-OPTICAL THREE-DIMENSIONAL COMPRESSION OF ELECTRON PULSES FOR ULTRAFAST ELECTRON IMAGING." Each of these applications is hereby incorporated herein by reference in its entirety.

GOVERNMENT SUPPORT

This invention was made with Government support under Grant No. D13AP00050 awarded by the U.S. Department of Interior and under Contract No. W911NF-13-D-0001 awarded by the Army Research Office. The Government has certain rights in the invention.

BACKGROUND

The ability of ultrafast X-ray and electron pulses to probe structural dynamics with atomic spatiotemporal resolution has fueled a wealth of exciting research on the frontiers of physics, chemistry, biology and materials science. Electrons normally have a shorter penetration depth compared to X-rays. However, given the same energy, the scattering cross sections of electrons can be $10^5$-$10^6$ times larger than that of X-rays. In addition, high intensity table-top electron sources are relatively more available, thereby favoring the application of electrons in the study of surfaces, gas phase systems and nanostructures.

One technology that employs ultrafast electron pulses to study materials is ultrafast electron diffraction (UED). UED is a form of pump-probe technique that can directly couple to structural dynamics using electron pulses as the probe. In a typical UED setup, an ultrafast laser pulse is split into a first part that is directly focused on to the sample to create a non-equilibrium state and a second part that is frequency tripled and focused on to a photocathode to generate electrons via photoelectric effect. The generated electrons are then accelerated through, for example, a high voltage (e.g., around 30-100 keV) and focused onto the sample. At these energies, the de Broglie wavelength $\lambda$ (~0.07 Å) of the electrons is normally smaller than the inter-atomic spacing so that the electrons can be diffracted from the sample and thus employed as a probe. Examining the diffraction pattern of the electron probe as a function of time delay with respect to the first part of the laser pulse can provide both the equilibrium structure and a movie of the structural evolution. In practice, UED can monitor the position, intensity, and width of the lattice Bragg spots as a function of time after the photo-excitation. Furthermore, ultrafast electrons can also be used in a closely related technique called ultrafast electron microscopy (UEM), which may directly record real space images of transient structures with ultrafast time resolution.

SUMMARY

Embodiments of the present invention include apparatus, systems, and methods of modulating a particle pulse. In one example, a method for modulating a particle pulse including propagating the particle pulse at a velocity v along a first direction and propagating an electromagnetic pulse along a second direction at an oblique angle $\theta$ with respect to the first direction in a laboratory frame of reference so as to cause the electromagnetic pulse to at least partially overlap with the particle pulse. The electromagnetic pulse has an intensity profile with a local minimum along at least one line passing through a center of the electromagnetic pulse. The oblique angle $\theta$ is based at least in part on the velocity v of the particle pulse.

In another example, an apparatus for modulating a particle pulse propagating at a velocity v along a first direction includes an electromagnetic radiation source, which provides an electromagnetic pulse having an intensity profile with a local minimum along at least one line passing through a center of the electromagnetic pulse. The apparatus also includes a beam steering optic, in optical communication with the electromagnetic radiation source, to direct the electromagnetic pulse along a second direction at an oblique angle $\theta$ with respect to the first direction in a laboratory frame of reference so as to cause the electromagnetic pulse to at least partially overlap with the particle pulse in a first interaction. The oblique angle $\theta$ is based at least in part on the velocity v of the particle pulse.

In yet another example, an apparatus for providing electron pulses includes an electron source, a laser, and a beam steering optic. The electron source provides an electron bunch propagating at a velocity v along a first direction in optical communication with the laser. The laser provides a laser pulse having a pulse duration shorter than 1 nanosecond and an intensity profile having a minimum within a center region of the intensity profile. The beam steering optics directs the laser pulse along a second direction at an oblique angle $\theta$ with respect to the first direction in a laboratory frame of reference. The beam steering optic is further configured to overlap the center region of the intensity profile with the electron bunch so as to longitudinally compress the electron bunch. The oblique angle $\theta$ is substantially equal to $\arctan(1/(\gamma\beta))$, where $\beta=(v/c)$, $\gamma=(1-\beta^2)^{-1/2}$, and c is a speed of light in a vacuum.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 10A-10F show longitudinal compression of a 30 keV electron pulse from 100 fs to 137 as.

DETAILED DESCRIPTION

The spatial and temporal resolution that can be achieved by ultrafast electron diffraction (UED) or ultrafast electron microscopy (UEM) can be dependent on the properties of the employed electron pulse, including the spot size, coherence length, and pulse duration. In general, a short pulse duration and smaller spot size can lead to a higher resolution. However, an electron pulse (sometimes also referred to as an electron bunch) tends to expand and acquire a velocity chirp during propagation at least due to space-charge (i.e., inter-electron repulsion) and dispersion resulting from an initial velocity spread. For example, the duration of a pulse containing 10,000 electrons after 10 cm of propagation at 30 keV can be limited to several picoseconds, which can impose limitations on the study of a wide range of important physical and chemical phenomena such as making-and-breaking of chemical bonds, photo-induced structural and electronic phase transitions, and excitation and detection of coherent optical phonons.

Several methods attempt to compress electron pulses in hope of achieving desired pulse properties (e.g., spot size, coherence length, pulse duration) when the electron pulses interact with the sample. Longitudinal compression (i.e., along the propagation direction of the electron pulse) methods include the use of electrostatic elements, microwave cavities, and optical transients. Transverse compression (i.e., along the direction orthogonal to the propagation direction of the electron pulse), also referred to as focusing, of an electron pulse is typically carried out with charged particle optics such as magnetic solenoid lenses. However, ultrashort electron pulses normally suffer from temporal distortions in magnetic lenses. More complicated combinations of charged particle optics for isochronic imaging are normally used to compensate these distortions.

Particle Pulse Compression Using Transient Electric Fields

Figure 1A:
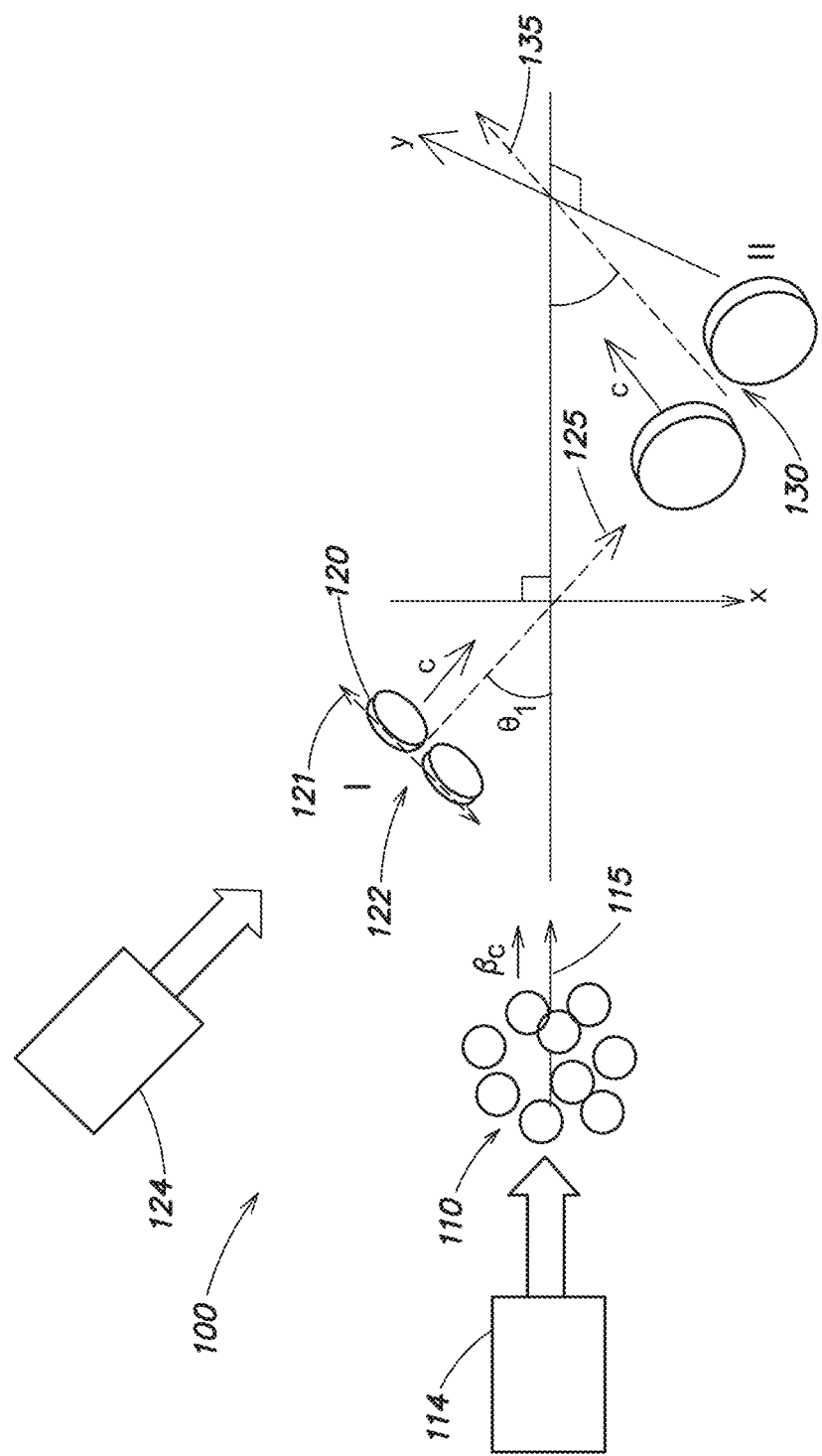
FIG. 1A illustrates a particle pulse modulation technique using transient electric fields.

FIG. 1A illustrates a technique 100 that can address, at least partially, challenges in electron pulse compression, or more generally, in particle pulse modulation. In the technique 100, a particle pulse 110 propagates at velocity v along a first direction 115. An electromagnetic pulse 120 propagates at velocity c along a second direction 125. The first direction 115 and the second direction 125 define an oblique angle θ1, which is based at least in part on the velocity v of the particle pulse, i.e., θ1=θ1(v). The oblique angle θ1 can be measured either between the second direction 125 and the first direction 115 or between the second direction 125 and the direction orthogonal to the first direction 115 (e.g., the x direction shown in FIG. 1A). For consistency, in this paper, the oblique angle θ1 is measured between the second direction 125 and the first direction 115, unless otherwise indicated.

The electromagnetic pulse 120 has an intensity profile with a local minimum 122 along at least one line 121 passing through a center of the electromagnetic pulse. The particle pulse 110 is provided by a particle pulse source 114, such as a charged particle source or a polarizable neutral particle source, and the electromagnetic pulse 120 is provided by an electromagnetic pulse source 124, such as a laser (e.g., a pulsed laser, a solid-state laser, etc.). Optionally, the technique 100 can further include a second electromagnetic pulse 130 propagating along a third direction 135 that is also at the oblique angle θ₁ with respect to the first direction 115.

Without being bound by any particular theory or mode of operation, the technique 100 relates to the controlled use of radiation pressure to impart a velocity modulation on moving particle bunches via one or more pulsed electromagnetic beams. The orientation of the pulsed electromagnetic beam or beams with respect to the particle bunch is based at least in part on the particle bunch's velocity and the desired properties of the modulation. More specifically, the technique 100 takes advantage of the ponderomotive force that the particles experience in an electromagnetic field. More specifically, a charged particle in an electromagnetic wave can experience a time-averaged force called the ponderomotive force that pushes the particle towards regions of lower optical intensity in the particle's rest frame. Dielectric particles can also be subject to ponderomotive force, and applications of electromagnetic ponderomotive forces have included atomic cooling, optical manipulation of living organisms, and plasma confinement.

The ponderomotive force can also be employed to compress a particle pulse 110 by subjecting the particle pulse 110 to the intensity minimum 122 of the electromagnetic pulse 120. Particles outside the intensity minimum 122 tend to move toward the minimum 122 under the ponderomotive force, thereby compressing the particle pulse 110 along the direction of the ponderomotive force. Depending on the direction of the ponderomotive force, the electromagnetic pulse 120 can be configured to achieve longitudinal compression and/or transverse compression at least by tuning the angle between the first direction 115 and the second direction 125.

For longitudinal compression (compression along and opposite the propagation direction 115, or collinear with the first direction 115), the oblique angle θ₁ in the lab frame can be based on the equation below:

$$\theta_l = \arctan\left[\frac{c \sin \theta_l''}{\gamma(c \cos \theta_l'' + v)}\right] = \arctan\left(\frac{1}{\gamma\beta}\right), \quad (1)$$

where the particle pulse 110 propagates in the +z-direction with a speed v≡βc (β is defined as v/c; c is the speed of light in vacuum), corresponding to the Lorentz factor $\gamma \equiv (1-\beta^2)^{-1/2}$. The first equality in equation (1) expresses the relation between the rest frame incidence angle $\theta_l''$ and lab frame incidence angle $\theta_l$. The second equality is made by setting $\theta_l''=90°$. Therefore, the oblique angle $\theta_l$ calculated according to equation (1) can result in a normal incidence angle in the rest frame of the particle pulse 110 and improve the compression efficiency. In addition, when the oblique angle $\theta_l$ is calculated according to equation (1), the induced velocity change in the longitudinal direction can be independent from the transverse coordinates without inducing transverse phase plane modulations, at the lowest order.

Figure 1B:
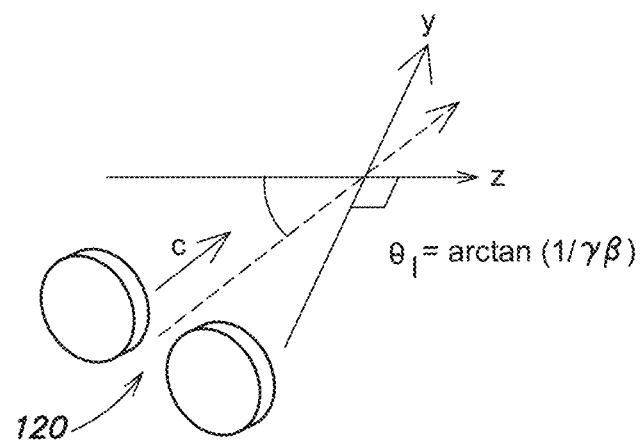
FIGS. 1B-1E illustrate the transformation of incidence angles between the lab frame and the rest frame of the particle pulse.
Figure 1C:
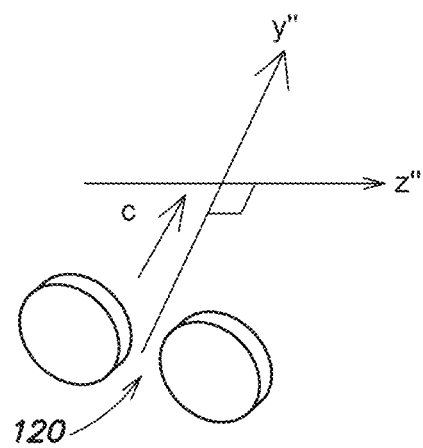
Figures 1D, 1E:
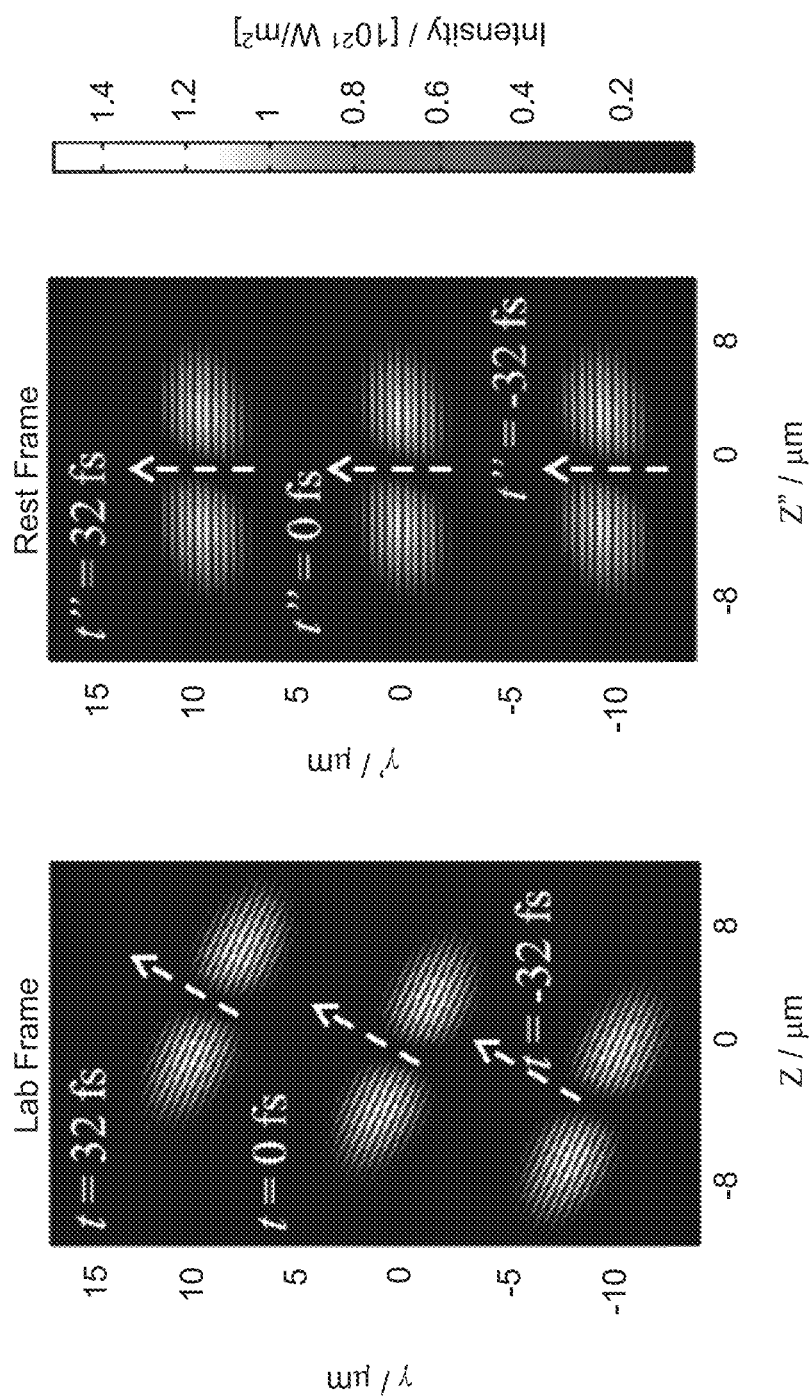

FIGS. 1B-1E illustrate the transformation of the incidence angle between the lab frame and the rest frame of the particle pulse. FIGS. 1B-1E, for illustrative purposes only, use an electromagnetic pulse 120 with a 350 mJ, 8 fs Hermite-Gaussian (first order) intensity profile. The electromagnetic pulse 120 in this example has a waist radius of 5 μm and a wavelength of 0.8 μm. FIG. 1B shows a schematic of the electromagnetic pulse 120 propagating in the lab frame. FIG. 1D shows the intensity profile of the electromagnetic pulse 120 at three different timing points (t=32 fs, t=0 fs, and t=−32 fs) along the propagation direction (z axis). The z axis of FIG. 1D is the first direction 115 along which the particle pulse 110 propagates. As can be seen from FIG. 1D, the electromagnetic pulse 120 propagates at an oblique angle (calculated according to equation (1)) with respect to the z axis. The oblique angle, as indicated by the dashed arrow, can be substantially away from the normal angle.

FIG. 1C shows a schematic of the electromagnetic pulse 120 propagating in the rest frame of a 30 keV particle pulse. FIG. 1E shows the intensity profile of the electromagnetic pulse 120 at three different timing points (t=32 fs, t=0 fs, and t=−32 fs) along the propagation in the rest frame. In FIG. 1E, the electromagnetic pulse is propagating perpendicular to the z'' axis, which is the propagation direction of the particle pulse in the rest frame.

In one example, the technique 100 includes only one electromagnetic pulse 120. In another example, the technique 100 can also include a second electromagnetic pulse 130. The second electromagnetic pulse 130 can have the same intensity profile as that of the first electromagnetic pulse 120. The second electromagnetic pulse 130 can propagate at the third direction 135, which can also have the oblique angle $\theta_l$ with respect to the first direction 115. Particle pulses in an electromagnetic field normally also experience some high-order modulations. The second electromagnetic pulse 130 can facilitate higher-order modulation to affect the transverse electron pulse properties equally in x direction and y direction (i.e., the two directions perpendicular to the propagation direction 115 of the electron pulse 110).

Figure 2A:
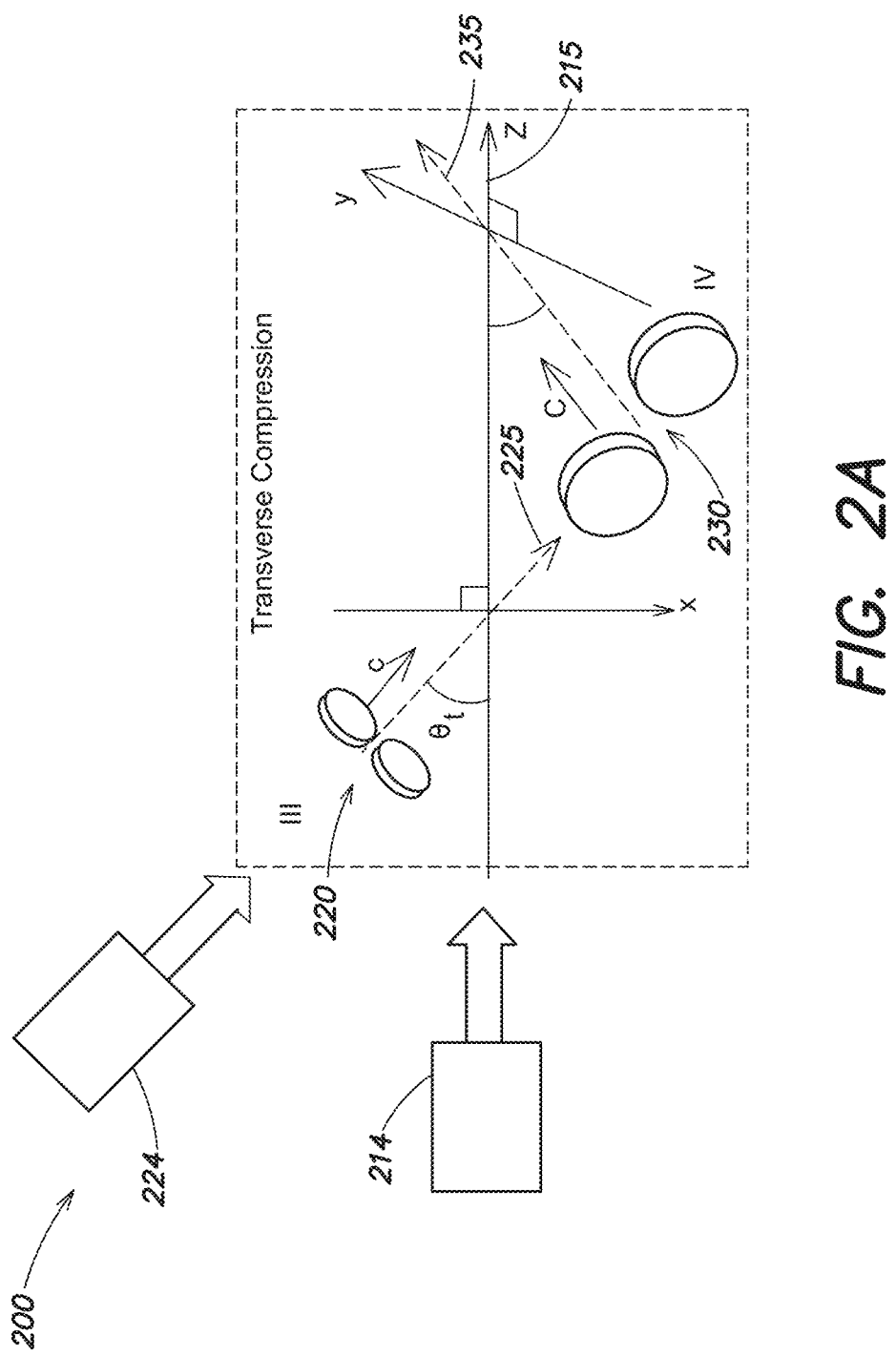
FIGS. 2A and 2B show transverse modulation of particle pulses using transient electric fields.

For transverse compression (also referred to as focusing), since the particle pulse 110 is stationary in its transverse dimensions, normal incidence in the rest frame can be achieved with any value of incidence angle in the lab frame for transverse compression, as illustrated in FIG. 2A. The technique 200 of in FIG. 2A includes a particle pulse (not shown), provided by a particle pulse source 214 (e.g., a charged particle source, such as an electron gun, or a polarizable neutral particle source), propagating along a first direction 215 and an electromagnetic pulse 220, provided by an electromagnetic pulse source 224 (e.g., a laser, optical parametric oscillator, or optical parametric amplifier), propagating along a section direction 225. The angle between the first direction and the second direction is defined as $\theta_t$. Optionally, the technique 200 can further include a second electromagnetic pulse 230 propagating in a third direction 235.

In transverse compression, one or more electromagnetic pulses compress the particle pulse from various directions. In one example, transverse compression can be performed by a first electromagnetic pulse compressing the particle pulse along the x direction and a second electromagnetic pulse compressing the particle pulse along the y direction (in Cartesian coordinates). In another example, the transverse compression can be achieved by an electromagnetic pulse having a axially symmetric intensity profile, which can compress the particle pulse along the radial direction symmetrically.

Figure 2B:
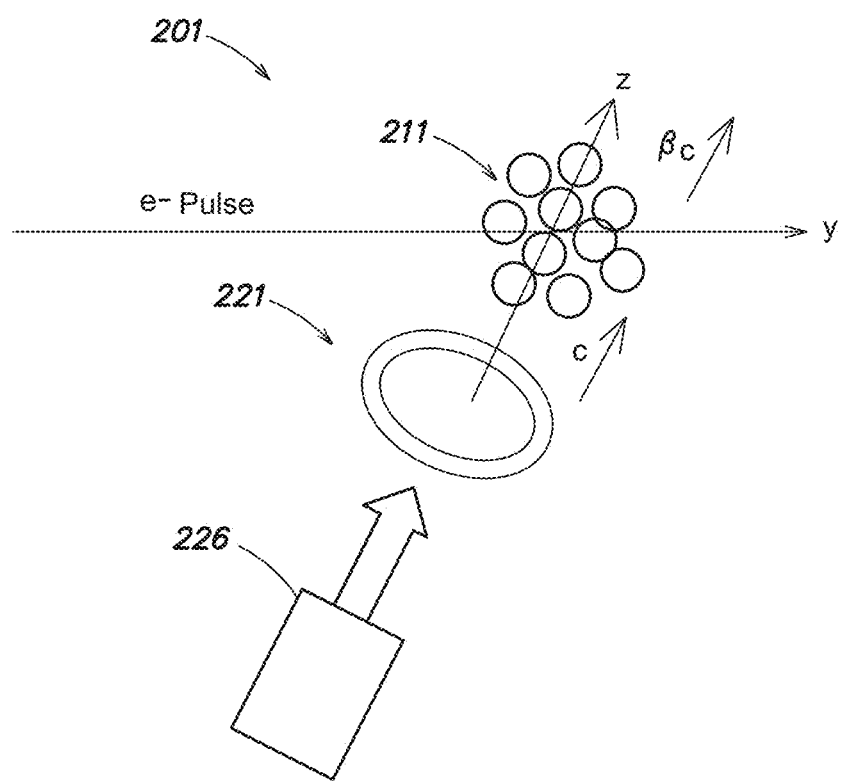

FIG. 2B shows a transverse compression technique 201, in which an electromagnetic pulse 221 having a Laguerre-Gaussian mode is provided by an electromagnetic pulse source 226 (e.g., a mode-locked laser, Q-switched laser, or other pulsed source) and co-propagates with a particle pulse 211. The Laguerre-Gaussian mode has a symmetric ring structure with a minimum in the center of the mode. Therefore, when the electromagnetic pulse 221 and the particle pulse 211 are co-propagating, particles in the particle pulse 211 can be maintained around the intensity minimum of the electromagnetic pulse 211, thereby undergoing extended compression along the propagation.

In three-dimensional compression, longitudinal and transverse compression states can be arranged in various orders, as long as inter-particle interactions and dispersion is negligible between interactions. Since the ponderomotive force is a non-linear effect (i.e., it is not directly proportional to electric field), the optical pulses can be sufficiently separated so that interference between the fields of different pulses does not reach significant levels.

In some examples, the spacing between laser-electron (or laser-particle) interactions can be less important, in which case the equation (2) may be relaxed. For example, when $\theta_t=0°$ and $\theta_l=\arctan(1/\gamma\beta)$, it is possible for both pulses of the transverse compression stage and one pulse of the longitudinal compression stage to be simultaneously incident upon the particle pulse in a three-dimensional bunch compression scheme, without compromising compression quality.

Figure 9A:
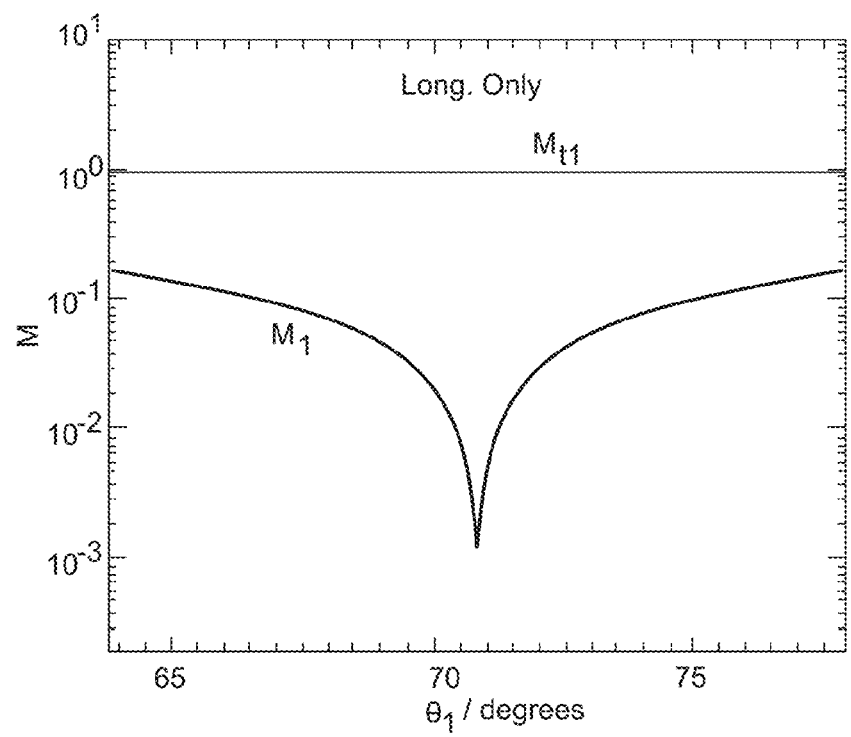
FIGS. 9A and 9B show the sensitivity of longitudinal and transverse compression ratios as a function of the incidence angle.
Figure 9B:
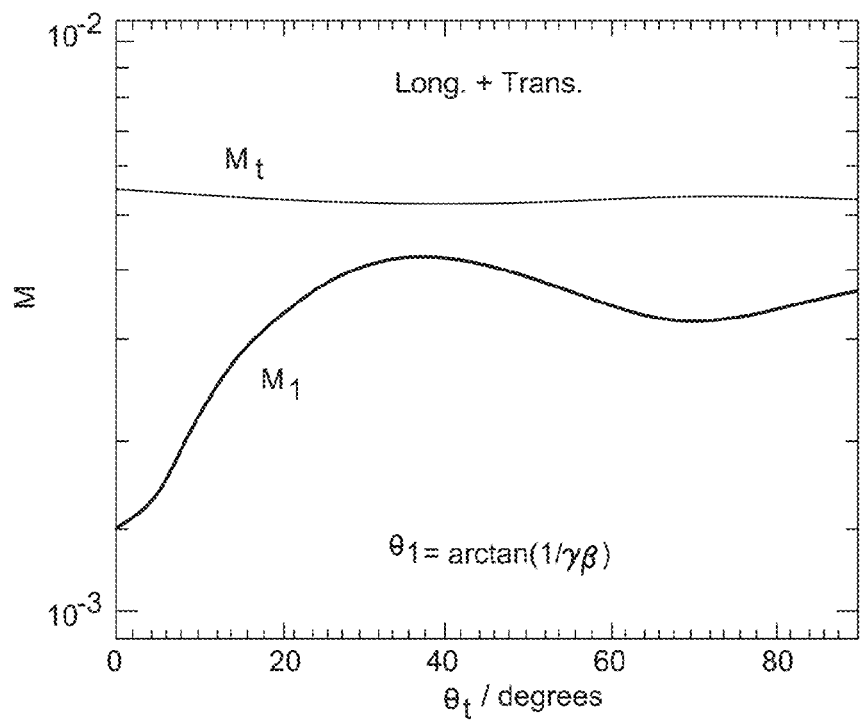

In one example, the technique 200 is implemented for transverse compression alone, in which case the transverse compression of particles can be a relatively weak function of $\theta_t$ (e.g., see FIGS. 9A-9B). In another example, the technique 200 can be combined with the technique 100 shown in FIG. 1A so as to achieve, for example, three-dimensional compression. In this case, the choice of $\theta_t$ may affect the longitudinal compression ratio in a three-dimensional compression scheme via the effect of higher-order terms. It can be helpful to propagate the electromagnetic pulse 220 substantially along the first direction 215 (i.e., $\theta_t=0°$ to achieve a larger overall compression ratio.

The particle pulses (e.g., the particle pulse 110) that can be used in techniques 100 and 200 can include various types of particles. In general, particle pulses can be modulated by the techniques 100 and 200 as long as particles in the particle pulses can experience the ponderomotive force in an electromagnetic field. In one example, the particle pulses can include charged particles, such as electrons, protons, or ions (molecular ions or atomic ions), among others. Electron pulses can be provided by, for example, radio frequency (RF) electron guns and Free Electron Lasers (FEL). In another example, the particle pulses can include neutral particles with non-zero polarizability (also referred to as polarizable particles) such as polarizable neutral atoms, dielectric nanoparticles, and bacteria and viruses.

The particle pulses can be either single-particle pulses or multi-particle bunches. The particle bunch may have various shapes, sizes, durations, and distributions (e.g. Gaussian, uniform, or ellipsoid). The techniques 100 and 200 can work for particles pulses propagating at various speeds. In one example, the particle pulses can be nearly still (v~0), in which case the techniques 100 and 200 can compress and cool the particle pulses. In another example, the particles can propagate at relativistic speeds (e.g., with pulse energies of >20 keV, >100 keV, >1 MeV, >100 MeV). In one example, there may be only one particle pulse. In another example, there may be a train of particle pulses.

The electromagnetic pulses 120 and 220 can have various intensity profiles (sometimes also referred to as modes). In one example, as shown in FIGS. 1-2, the electromagnetic pulses are in first-order Hermite-Gaussian modes, which have a minimum intensity in the center and two lobes on each side of the minimum. The intensity of a first order Hermite-Gaussian mode along a line connecting the two lobes can have a well shape (minimum in the center). However, the intensity of a first order Hermite-Gaussian mode along a direction perpendicular to the line connecting the two lobes typically does not have a minimum in the center. Therefore, first-order Hermite-Gaussian modes can be used to independently control the compression in each Cartesian dimension without affecting particle pulse properties in orthogonal dimensions, at the lowest order.

First-order Hermite-Gaussian modes can be generated by various methods. In one example, first-order Hermite-Gaussian modes can be directly generated by end-pumped solid state lasers. More specifically, a movable opaque wire can be inserted into a solid state laser resonator so as to control the gain of each possible mode. More details can be found in "Generation of high-order Hermite-Gaussian modes in end-pumped solid-state lasers for square vortex array laser beam generation" (S. C. Chu, et al., *Optics Express*, Vol. 20, No. 7, pp. 7128-7141, 2012), the entirety of which is incorporated by reference herein. In another example, first-order Hermite-Gaussian modes can be generated by passing half of a fundamental mode through a waveplate but not the other half. More specifically, a Gaussian beam can be bisected at the edge of a half waveplate. The polarization of the incident beam can be perpendicular to the edge of the waveplate. This arrangement can delay one half of the beam by 180° and therefore can favor the conversion to the Hermite-Gaussian (1,0) mode. More details can be found in "Near-field Optical Imaging Using Metal Tips Illuminated by Higher-Order Hermite-Gaussian Beams" (L. Novotny et al., *Ultramicroscopy*, vol. 71, pp 21-29, 1998), the entirety of which is incorporated by reference herein. In yet another example, first-order Hermite-Gaussian modes can be generated by a suitable holography technique or spatial light modulators.

Many of these modes are also generated by superposing modes from other families. For instance, Laguerre-Gaussian (LG) modes can be generated simply by superposing Hermite-Gaussian modes. (e.g. TEM10+TEM01=TM10), and Hyper-geometric Gaussian modes can be generated by superposing the right LG modes.

Figure 3:
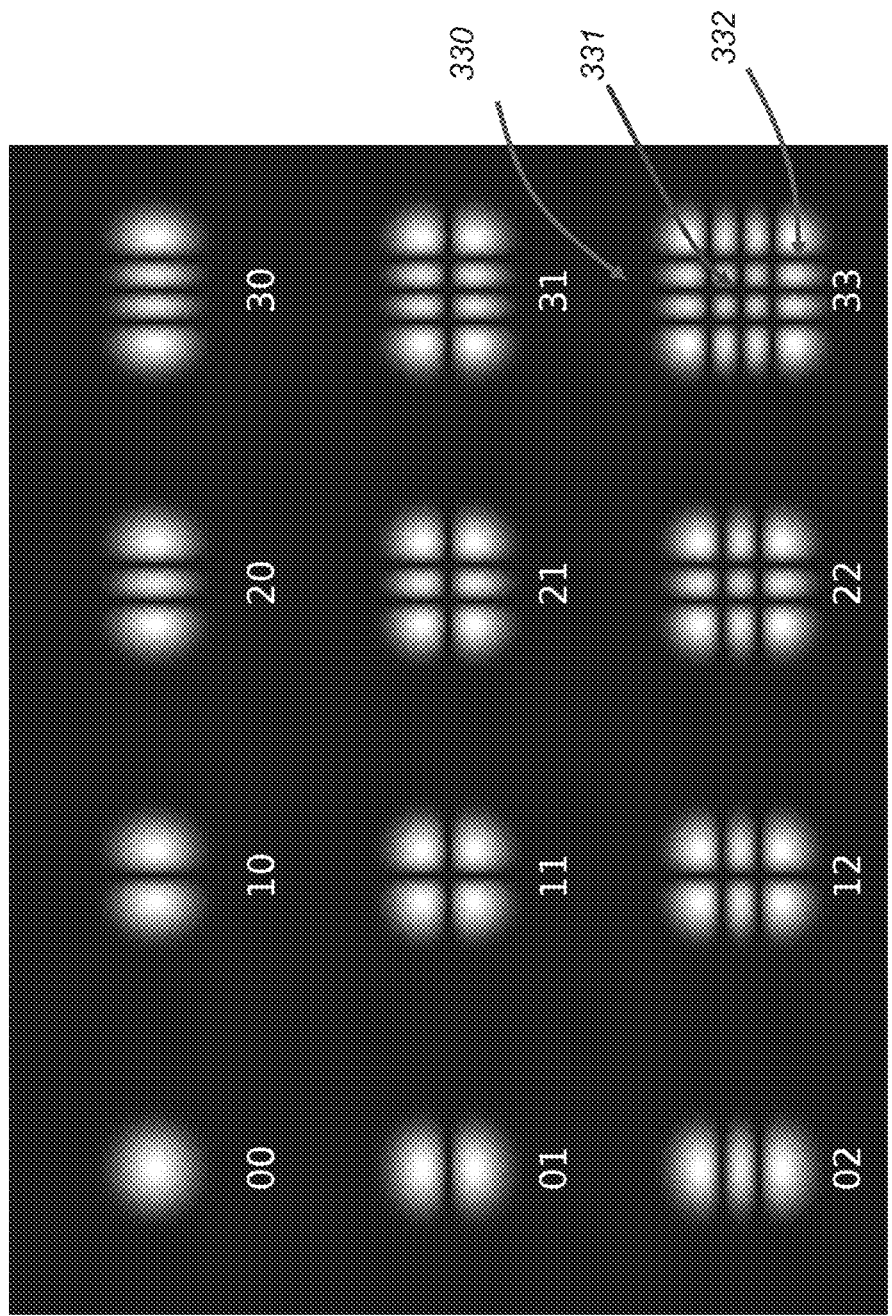
FIG. 3 shows the intensity distributions of Hermite-Gaussian modes of various orders.

In another example, higher order Hermite-Gaussian modes can be used. FIG. 3 shows Hermite-Gaussian modes of a light pulse of various orders. It can be seen that different orders of Hermite-Gaussian modes can have different number of intensity minimums. These multiple minimums in a single Hermite-Gaussian mode of high order can be employed to, for example, divide a giant electron pulse bunch into many sub-bunches. The division can be on either longitudinal direction or transverse direction.

It is worth noting that Hermite-Gaussian modes of non-zero orders are normally undesirable in many conventional laser applications. In laser applications such as plasma creation, imaging, or optical communication, it is generally desirable to have a Hermite-Gaussian beam of zeroth order (fundamental mode) because of its axial symmetry. Non-zero orders, as used here, are normally deemed defective, with much effort spent on avoiding higher-order Hermite-Gaussian outputs from lasers. Therefore, techniques 100 and 200 take advantage of the otherwise undesirable high order Hermite-Gaussian modes and use them to effectively compress particles pulses.

In yet another example, the electromagnetic pulses can have other free-space modes, such as Laguerre-Gaussian, Ince-Gaussian, Bessel-Gaussian, and Hypergeometric-Gaussian modes, among others, as long as at least one intensity minimum exists in at least one dimension of the total electromagnetic field.

The intensity minimum can be either a local minimum or an absolute minimum. In addition, the intensity minimum can be located at any place within an electromagnetic pulse. Stated differently, any intensity minimum within an electromagnetic pulse may be used for particle pulse modulation according to techniques described herein. For example, FIG. 3 shows a $TEM_{33}$ mode 330 at the lower right corner. The $TEM_{33}$ mode can have a first minimum 331 in the center of the mode and a second minimum 332 at the corner. Either the first minimum 331 or the second minimum 332 can be used for particle pulse modulation.

The electromagnetic pulses can have various polarizations, such as linear polarization, radial polarization, azimuthal polarization, and circular polarization, among others.

In yet another example, an electromagnetic pulses can also be a superposition of electromagnetic modes, including but not limited to the case where the superposition can create a parabolic or quasi-parabolic intensity profile in the rest frame of the particle bunch. A parabolic ponderomotive potential can impart an impulse that can potentially compress a particle bunch to a theoretical limit (e.g., imposed by initial energy spread). A parabolic or quasi-parabolic intensity profile can also lead to significant energy savings (e.g., by increasing the compression efficiency). For example, a superposition of several odd Hermite-Gaussian $TEM_{mn}$-modes can suppress non-linear terms in the dependence of the electric field on the transverse x direction, thereby generating an electric field profile that can vary linearly across a large part of the pulse's cross section. Since intensity is proportional to the square of the electric field, the resulting intensity profile can be close to parabolic.

In yet another example, the electromagnetic pulses can be a superposition of laser beams of multiple frequencies, such as two-color or three-color beams. In the case of a stationary particle bunch, the laser beams may also be continuous-wave (CW) and monochromatic.

The electromagnetic pulses can also have various wavelengths. In one example, the electromagnetic pulses can be provided by lasers, such as diode lasers (e.g., emitting at about 900 nm), Nd:YAG solid state lasers (emitting a fundamental beam at 1064 nm or harmonics at 532 nm and/or 355 nm), Ti:Sapphire solid state lasers (emitting at 800 nm), fiber lasers (Er-doped at 1.55 µm, Yt-doped at 1.06 µm, Ho-doped at 2.05 µm), $CO_2$ laser (9.4 and 10.6 µm), or any other types of laser known in the art. In another example, the electromagnetic pulses can be provided by an optical parametric oscillator (OPO) or an optical parametric amplifier (OPA), which can extend wavelength of emissions to ultra-violet and infrared regions. In yet another example, the electromagnetic pulses can be provided by quantum cascade laser operating at mid-infrared region. In yet another example, the electromagnetic pulses can be provided by radio frequency sources operating at wavelengths from about 1 mm to about 300 mm. In general, a longer wavelength can result in a stronger ponderomotive force and accordingly larger compression ratio. But it may also be more challenging to produce ultra-short electromagnetic pulses at longer wavelengths such as radio frequency.

The electromagnetic pulses can also have various intensities. In general, a higher intensity can result in a stronger ponderomotive force. Therefore, it can be helpful to employ higher intensity pulses when practical.

The electromagnetic pulses and the particle pulses can have several different relative dimensions. In one example, the waist radius of the electromagnetic pulses can be larger than the half length of the particle pulses so as to compress the entire particle pulses. In another example, the waist radius of the electromagnetic pulses can be smaller than the half length of the particle pulses so as to compress or modulate only a designated portion of the particle pulses.

Cascade Particle Pulse Compression

Figure 4A:
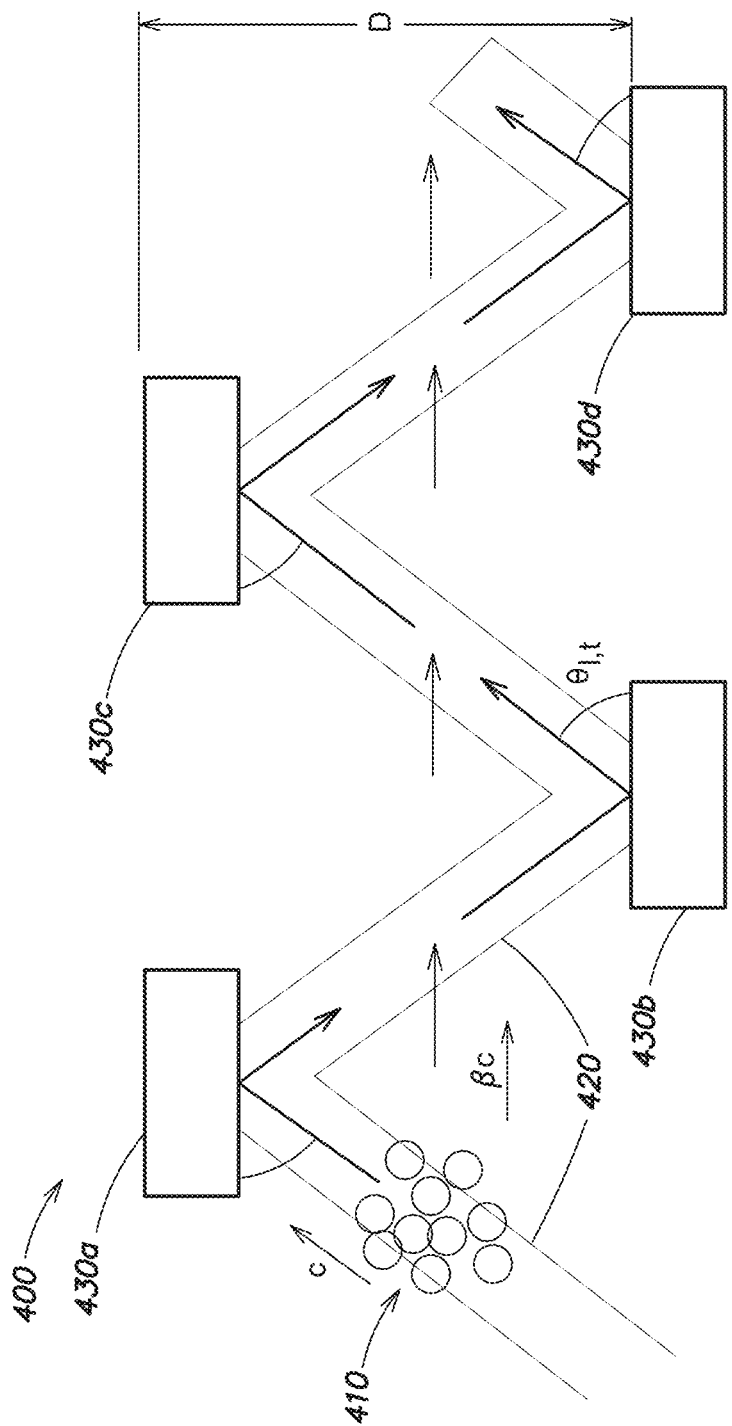
FIGS. 4A-4E show schematics of cascade compression of particle pulses.
Figure 4B:
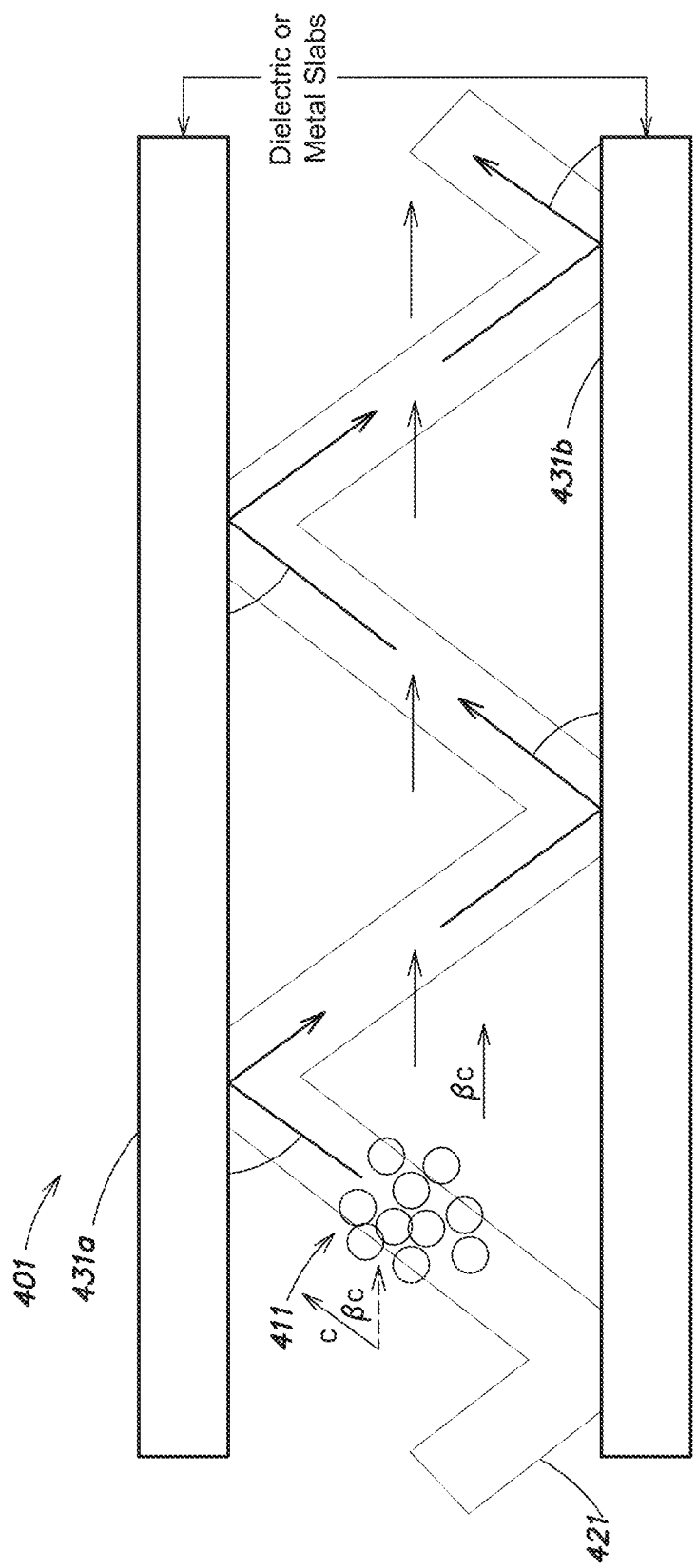

Equation (1) can also provides a condition for matching the group velocities of the particle pulses and the electromagnetic pulses along the axis of particle pulse propagation (i.e., c cos $\theta_i$=cβ≡v). This observation can be helpful in cascaded compression schemes, as shown in FIGS. 4A and 4B. FIG. 4A shows a cascade compression scheme 400 in which an electromagnetic pulse 420 is reflected and refocused by a succession of optical stages 430a-430d, so as to be repeatedly incident upon the electromagnetic pulse 410. This cascade compression scheme allows the electromagnetic pulse to be utilized for many times thereby increasing the energy efficiency as well as simplifying experimental setup. If equation (1) is satisfied, the interval between laser-electron coincidences is $$T_{coin} = \frac{\gamma D}{c}, \quad (2)$$

assuming that the electron pulse is injected along the axis of symmetry of the setup, and that the optical components introduce no delays. To avoid optical interference between successive interactions, D can generally be chosen so that $T_{coin} \gg \tau$, where τ is the electromagnetic pulse duration.

In one example, each of the optical stages 430a-430d includes an reflector that reflects the electromagnetic pulse 420 back to the particle pulse 410 along the direction at an oblique angle satisfying equation (1). In this case, the reflectors can be parallel to the propagation axis defined by the propagation direction of the particle pulse 410.

In another example, each of the optical stages 430a-430d can direct the electromagnetic pulse 420 toward a different direction. For example, the first optical stage 430a can direct the electromagnetic pulse 420 along a direction having an oblique angle satisfying equation (1) with respect to the particle pulse propagation so as to improve longitudinal compression. The second optical stage 430b, however, may direct the electromagnetic pulse 420 toward a different direction so as to facilitate transverse compression.

In one example, the electromagnetic pulse 420 can be from a single source, i.e., the same electromagnetic pulse is reflected by all optical stages 430a-430d. In another example, multiple sources can be used to provide electromagnetic pulses at each stage from 430a to 430d so as to allow individual and independent control of each optical stage (e.g., compression ratio, wavelength, direction of the electromagnetic pulse, etc.). A single pulsed source can also be use to provide multiple pulses 420.

FIG. 4B shows a cascade compression scheme, in which the series of components that reflect the electromagnetic beam may be implemented by an enclosing or half-enclosing structure. More specifically, the cascade compression scheme 401 includes a pair of reflective walls 431a and 431b that substantially enclose an particle pulse 411 and an electromagnetic pulse 421. The two reflective walls 431a and 431b repeatedly reflect the electromagnetic pulse 421 back to interact with the particle pulse 411 so as to improve compression efficiency.

In one example, the pair of reflective walls 431a and 431b can be two flat reflectors disposed parallel to each other and further parallel to the propagation axis of the particle pulse 411. In addition, the two flat reflectors can be disposed at an equal distance away from the propagation axis of the particle pulse 411.

In another example, the pair of reflective walls 431a and 431b can form a cavity structure, in which the electromagnetic pulse 431 resonates so as to improve the compression efficiency by increasing the trapping time of the electromagnetic pulse 421 within the cavity structure. In this case, the two reflective walls 431a and 431b can be either flat or curved depending on the geometry of the cavity.

In yet another example, the pair of reflective walls 431a and 431b can be part of a waveguide structure (e.g., a planar waveguide or a fiber). The cross-section of the waveguide may be circular, rectangular, hexagonal, octogonal etc. The waveguide structure may also be only partially-enclosing, taking for instance the form of a pair of rectangular slabs.

Delay stages may be used to delay the electromagnetic pulse relative to the particle pulse in the z-direction. Similarly, "parallel propagation" stages—in which the electromagnetic pulse can propagate parallel (or at a small angle) to the electron pulse—may be used to enable the electromagnetic pulse to catch up with the particle pulse in the z-direction. The possible inclusion of these two features—delays stages and "parallel propagation" stages—allow the cascaded compression scheme of FIG. 4A to be used for any optical incidence angle.

Figure 4C:
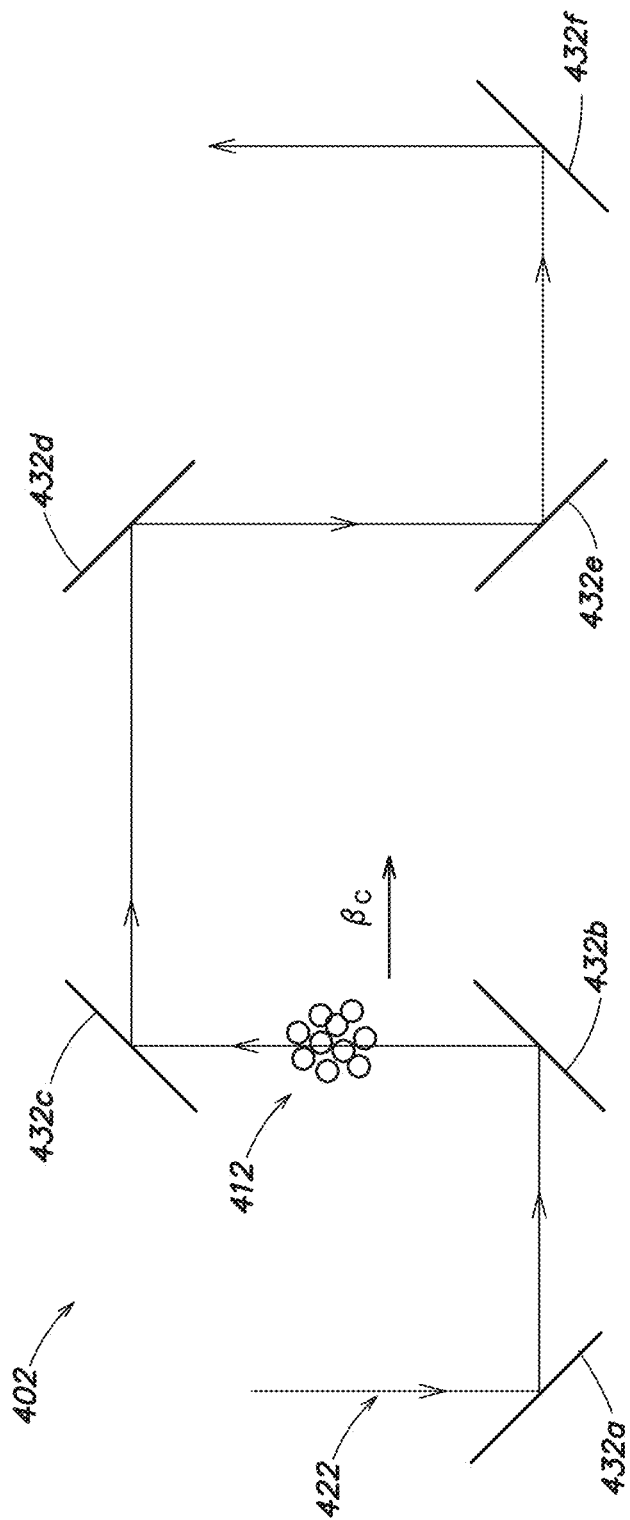

FIG. 4C shows a compression scheme 402 in which a delay stage including beam steering optics 432a to 432f can steer an electromagnetic pulse 422 to propagate at a direction perpendicular to the propagation direction of a particle pulse 412. The distance between, for example, optics 432c and 432d can be adjusted using the delay stage (not shown) to change the relative timing between the electromagnetic pulse 422 and the particle pulse 412. Similarly, the distances between 432a and 432b and between 432e and 432f can also be adjusted to change the relative timing. The relative timing can be adjusted so that the same electromagnetic pulse repeatedly coincides with the propagating particle pulse.

Figure 4D:
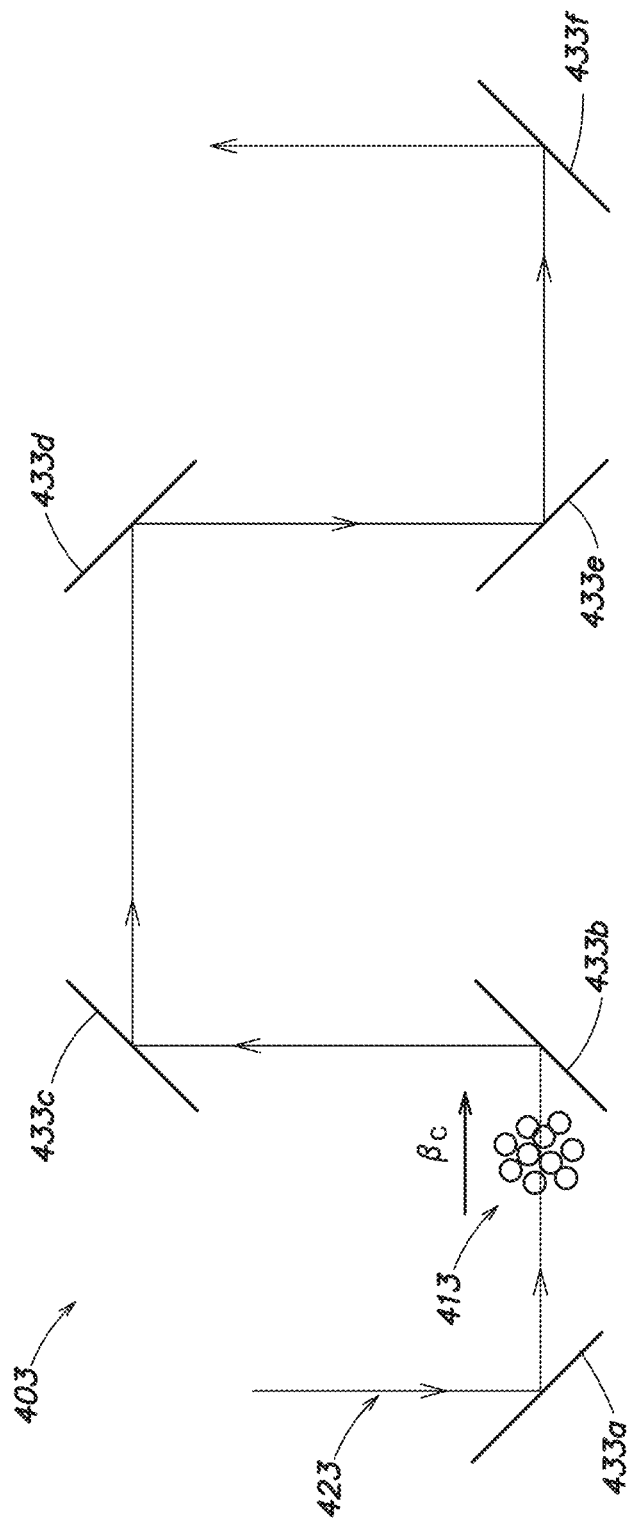

FIG. 4D shows a compression scheme 403, in which a delay stage including beam steering optics 433a to 433f can steer an electromagnetic pulse 423 to propagate at a direction parallel to the propagation direction of a particle pulse 413. Similarly, distances between steering optics pair (e.g., between 433c and 433d) can be adjusted (e.g., using suitable actuators) to adjust the relative timing between the particle pulse 413 and the electromagnetic pulse. In addition, in FIG. 4D, steering optics 433a, 433b, 433e and 433f can have a hole in the center so as to pass the particle pulse 413.

Figure 4E:
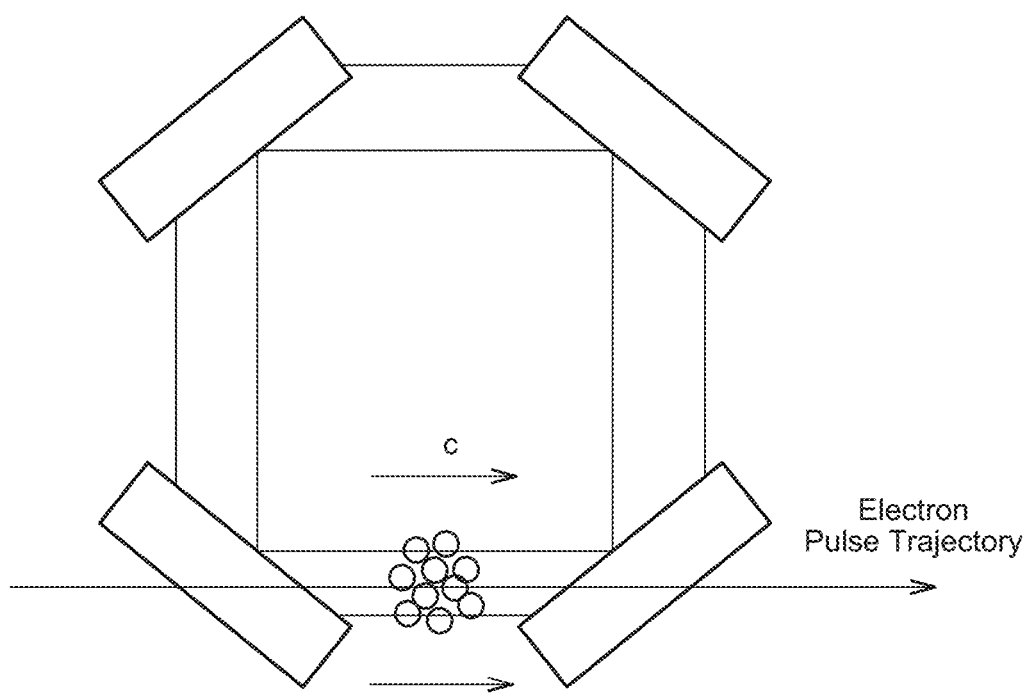

FIG. 4E shows how an electromagnetic pulse that co-propagates with the particle (or particle) pulse during interaction may be re-used for multiple particle pulses of a particle pulse train. It may be helpful to synchronize the period of the particle pulse train with the period of the cavity. By adjusting the angle of the reflecting components, the design can be adapted to any optical incidence angle. Variations of the scheme in FIG. 4E include cases where the laser beams cross (e.g.: forming an 'X' instead of a square), or where a different number of reflectors are involved.

Modulation of Particle Pulses

The techniques 100 and 200 can be extended to applications other than particle pulse compression. In one example, the techniques 100 and 200 can be configured to modulate the particle pulses, such as to alter (e.g., enhance, reduce, or eliminate) pre-existing velocity chirps. Reducing or eliminating pre-existing velocity chirps can amount to cooling (i.e., reducing the energy spread of) the particle bunch in the rest frame of the bunch centroid. In another example, the techniques 100 and 200 can be configured to impart a position-dependent angular impulse to particles in a particle bunch. In this case, $\theta_i$ can be chosen according to equation (14) described in detail below.

Figure 5:
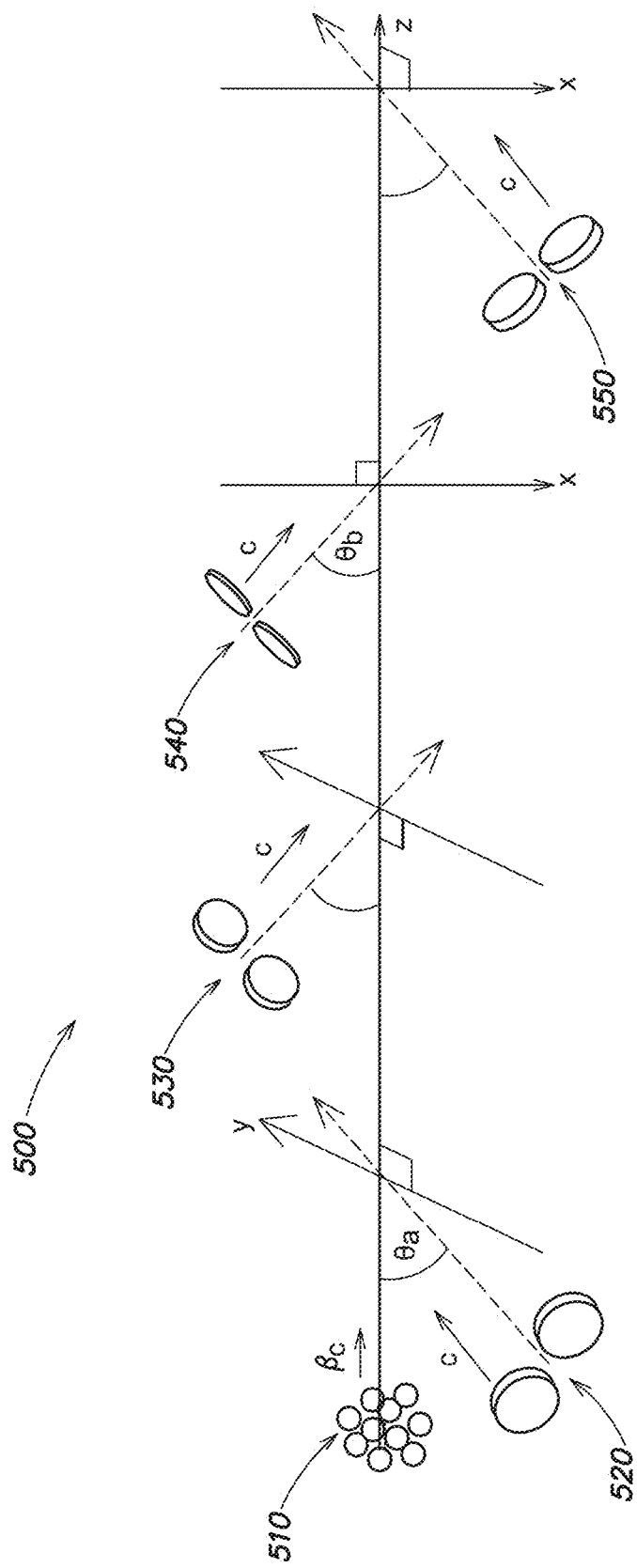
FIG. 5 shows a particle pulse modulation technique using with control over the ratio of longitudinal compression to transverse compression.

In one example, the oblique angle $\theta_i$ can be configured according to equation (1) (i.e., $\theta_i = \arctan(1/\gamma\beta)$). In another example, the oblique angle $\theta_i$ can be different from $\arctan(1/\gamma\beta)$ in order to take into account other considerations such as desired modulation to the particle pulses and/or experimental constraints. FIG. 5 shows a particle pulse modulation scheme 500, in which electromagnetic pulses 520, 530, 540, and 550 are propagating at the same angle $\theta$ with respect to the propagation of the an particle pulse 510, i.e., $\theta_a = \theta_b = \theta$. The total impulse transfer can be given by the formula (obtained simply by adding (14) described below for different transverse dimensions and opposite signs of $\theta$):

$$\Delta \vec{p}'' = m_0 K_l \frac{1}{\gamma^2 (1-\beta \cos \theta)^3} \left[ -\hat{y}\gamma(\beta - \cos \theta)^2 \Delta y'' - \hat{x}\gamma(\beta - \cos \theta)^2 \Delta x'' - \hat{z} \frac{2\Delta z'' \sin^2 \theta}{\gamma} \right].$$

Maximum compression can be independent of $\theta$. $\theta$ can be instead used to control the ratio of transverse to longitudinal impulse.

Figure 6A:
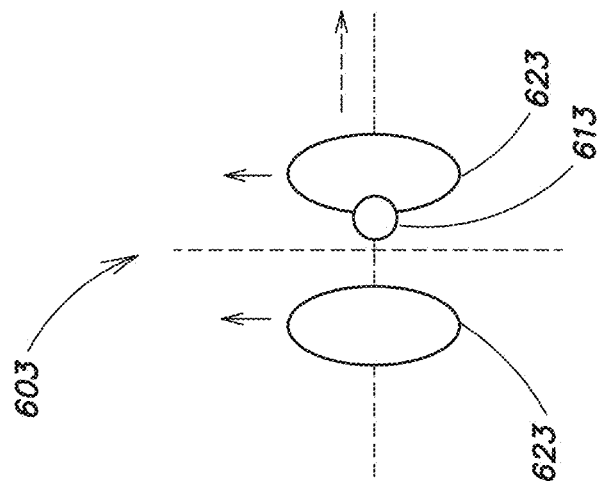
FIGS. 6A-6C show particle pulse modulation techniques in which particles pulses can be accelerated and/or decelerated.
Figure 6B:
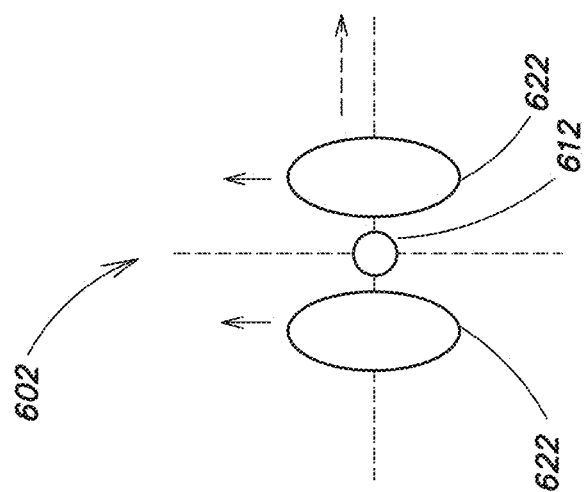
Figure 6C:
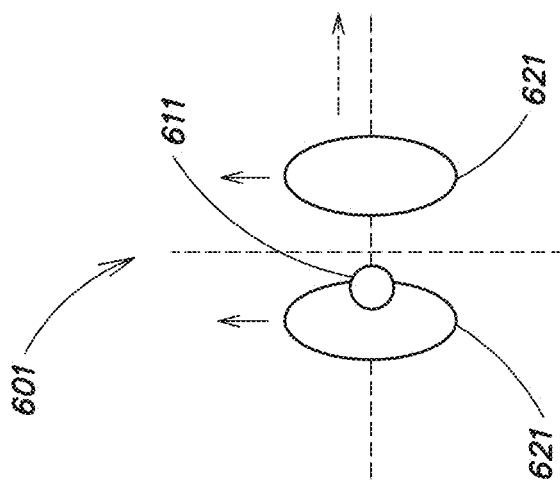

FIGS. 6A-6C illustrate a scheme in which particle pulses can be compressed and decelerated or accelerated at the same time in the rest frame of the particle pulses. FIG. 6A shows a particle modulation scheme 601 in which a particle pulse 611 can be compressed and accelerated by an electromagnetic pulse 621. The electromagnetic pulse 621 has a first order Hermite-Gaussian mode (including two lobes and minimum in the center). The particle pulse 611 is propagating along a horizontal direction as indicated by the dashed arrow.

In FIG. 6A, the particle pulse 611 is disposed behind the minimum of the electromagnetic pulse 621 along the particle pulse propagation direction. In this case, the ponderomotive force upon particles in the particle pulse is along the propagation direction of the particle pulse (point toward the minimum), therefore, the particle pulse 611 can be accelerated. At the same time, the front of the particle pulse 611 can experience a weaker ponderomotive force (due to smaller field gradient) compared to the ponderomotive force experienced by the trail of the particle pulse 611. Therefore, the net effect of the ponderomotive force can "push" the trail more than it does to the front, thereby also compressing the particle pulse 611.

FIG. 6B shows a particle modulation scheme 602 in which a particle pulse 612 can be compressed. In this case, the particle pulse 612 is disposed symmetrically with respect to the a central region of the electromagnetic pulse 622. Therefore, the ponderomotive force symmetrically pushes the particle pulse 611 from both direction along the propagation direction of the particle pulse 612 and opposite the propagation direction of the particle pulse 612. FIG. 6C shows a particle modulation scheme 603 in which a particle pulse 613 can be compressed and decelerated. This configuration is the opposition to the configuration shown in FIG. 6A. In FIG. 6C, the particle pulse 613 is disposed before the intensity minimum of the electromagnetic pulse 623 along the propagation direction of the particle pulse 613. Therefore, the net effect of the ponderomotive force tends to push the particle pulse back (i.e., opposite the propagation direction), thereby decelerating the particle pulse 613.

In yet another example, the techniques 100 and 200 may be configured to decompress particle pulses by using electromagnetic pulses having an intensity profile with a maximum in the center (e.g., Gaussian pulse). This decompression may be employed to, for example, modulate the compressed particle pulse, or fine tuning of the electron velocity distribution. More specifically, after compressing an electron pulse, it might be helpful to use another laser pulse with an intensity maximum to cancel the momentum spread or modulation that was introduced to bring about the compression. In ultrafast electron diffraction, for instance, a smaller energy spread can be desirable since it can lead to a larger coherence length. This decompression approach can be especially applicable for single-electron pulses where space charge (i.e. inter-electron repulsion) can be negligible to make the particles repel each other.

The systems and apparatus shown in FIGS. 1-2 can either work alone or in combination with other systems. In one example, systems and apparatus shown in FIGS. 1-2 function as a source of ultrafast particle pulses. In this case, systems and apparatus include a particle source and components that accelerate and compress the particle pulses for practical applications such as imaging. In another example, methods and apparatus shown in FIGS. 1-2 function as a particle pulse compressor. In this case, systems and apparatus can receive particle pulses, compress the particle pulses, and deliver the compressed particle pulses for practical applications (analogous to, for example, a grating compressor used in chirped pulse amplification techniques). In yet another example, systems and methods shown in FIGS. 1-2 can be used in combination with non-optical components, such as electrostatic, magnetostatic, radio-frequency (RF), and microwave compressors. For instance, systems and apparatus shown here can be placed before or after a direct current (DC) solenoid so as to focus the particle pulse transversely.

Figure 7:
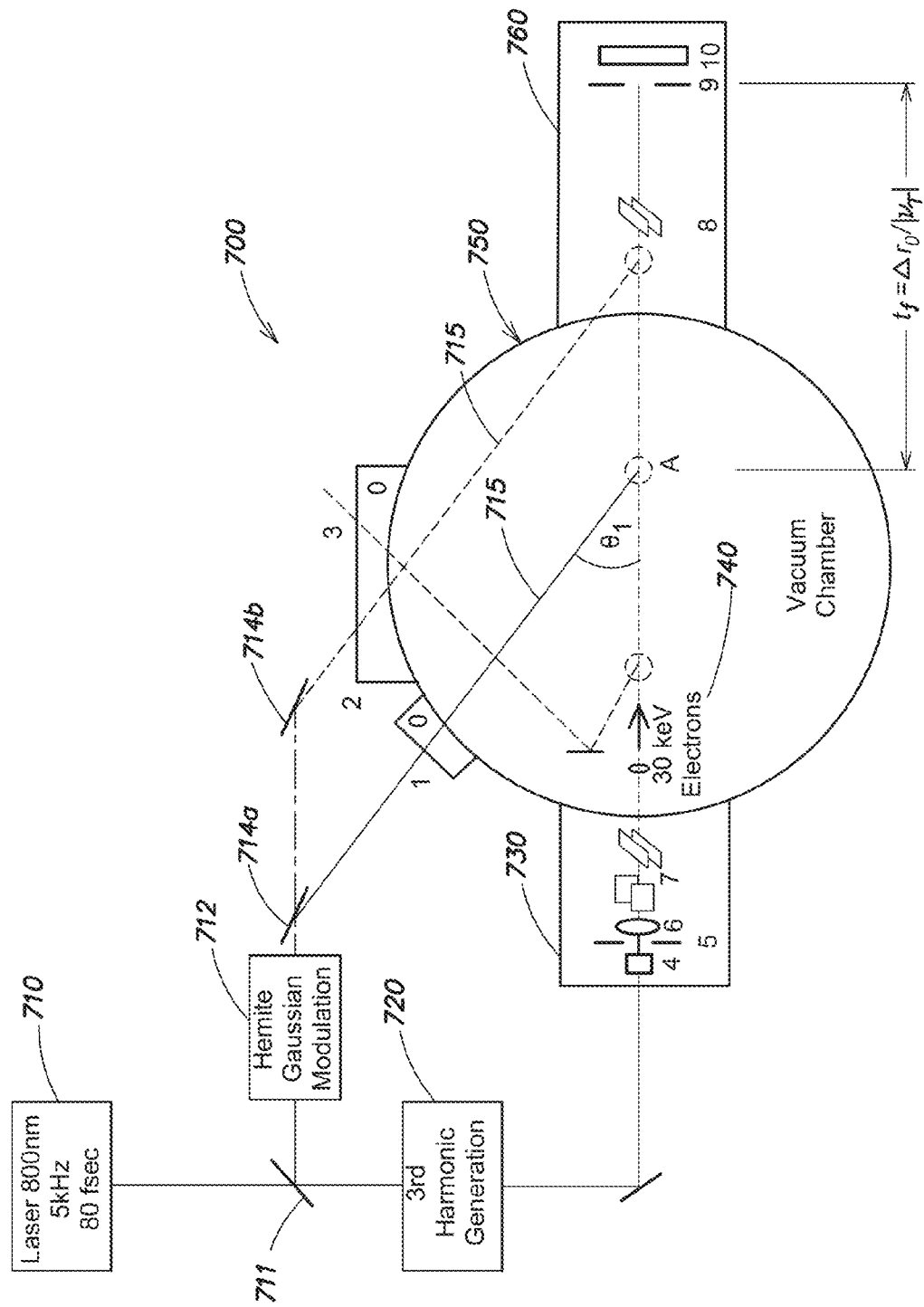
FIG. 7 shows a schematic of an apparatus for particle pulse modulation.

FIG. 7 shows a schematic of an apparatus that can implement various techniques shown in FIGS. 1-6. The apparatus 700 includes a laser source 710 (e.g., 800 nm, 5 kHz repetition rate, and 80 fs pulse duration for each output laser pulse). The laser pulse delivered by the laser source 710 is split by a beam splitter 711 into two portions. The first portion is transmitted to a Hermite-Gaussian modulator 712 so as to generate high-order Hermite-Gaussian modes (non-zero order). In one example, the Hermite-Gaussian modulator 712 can be a half waveplate that transmits half of the laser pulse, which can be a in fundamental Gaussian mode so as to generate first-order Hermite-Gaussian modes. In another example, the Hermite-Gaussian modulator 712 can include a beam-combining optic that receives and combines multiple Hermite-Gaussian modes so as to create higher-order Hermite-Gaussian modes.

The high-order Hermite-Gaussian modes are then steered into a chamber 750 by a first steering optic (e.g., reflector) 714a. The first steering optic 714a can also be a beam splitter, which reflects part of the high-order Hermite-Gaussian beam to the chamber but also transmits part of the high-order Hermite-Gaussian beam to a second beam steering optic 714b. The second beam steering optic 714b can also reflect the transmitted Hermite-Gaussian mode to the chamber. The reflected Hermite-Gaussian modes 715 (from both 714a and 714b) can be parallel and define an oblique angle θ1 with respect to the axis of the vacuum chamber. The two steering optics 715a and 715b 714a and 714b can be configured to tune the oblique angle with respect to the axis of the chamber over a range of about 10 o to about 80 o so as to accommodate different electron pulse velocities.

The second portion of the beam from the laser source that is transmitted through the beam splitter 711 is then delivered for 3rd harmonic generation 720. The generated third harmonic is then sent to an electron gun 730, where the third harmonic can generate electrons by, for example, bombarding a photocathode via photoelectric effect. The electrons can then be accelerated into an electron pulse 740 propagating along the axis of the vacuum chamber 750. The electron pulse 740 and the reflected Hermite-Gaussian pulses 715 interact in the vacuum chamber 750, resulting in the modulation of the electron pulse. The modulated electron pulse can then go to a detector unit 760 for further analysis or applications.

Analytical Investigation of Particle Pulse Modulation

The particle pulse compression techniques described above can be theoretically analyzed as following. Analytical expressions can be derived for approximating the ponderomotive potential and net impulse associated with transverse and longitudinal compression using pulsed Hermite-Gaussian $TEM_{mn}$ modes of arbitrary order. When equation (1) is satisfied, the induced velocity change for longitudinal compression can be independent from transverse coordinates and therefore transverse phase plane modulations can be avoided, at the lowest order. Although charged particles are used for illustrative purposes, this theoretical analysis applies to any particle with non-zero polarizability in the Rayleigh regime (particle size much smaller than electromagnetic wavelength) by the simple replacement of a constant factor.

Without being bound by any particular theory, the ponderomotive force experienced by a charged particle in an electromagnetic wave can be written as:

$$\vec{F} = -\nabla U_p + \ldots, \quad (3)$$

where the ponderomotive potential $U_p$ is $$U_p \equiv \frac{q^2}{4m_0\omega^2}|\vec{E}_a|^2, \quad (4)$$

and q and $m_0$ are respectively the particle's charge and rest mass. The particle sees the electric field $\vec{E}=(\vec{E}_a e^{i\omega t}+c.c.)/2$, where $\vec{E}_a$ varies slowly in time compared to the carrier factor and $i \equiv \sqrt{-1}$. The ellipsis in equation (3) hides terms proportional to $e^{\pm i\omega t}$ and $e^{\pm i2\omega t}$. Equation (3) can be derived from the Newton-Lorentz equation in the rest frame of the initial particle. The notion that a particle experiences a force proportional to the gradient of electromagnetic intensity can be valid in the rest frame of the particle. The net momentum imparted to a particle by the passage of a many-cycle pulse can be written as:

$$\Delta \vec{p} = \int \vec{F} dt = -\int \nabla U_p dt, \quad (5)$$

Physically, the electric field can cause the charged particle to oscillate about its initial position, generating an effective dipole that is subject to the same radiation pressure forces experienced by dielectric particles in optical tweezers. In fact, replacing $q/m_0\omega^2$ by $\alpha/2$ turns equation (4) into the ponderomotive potential of a particle in the Rayleigh regime, where the particle's polarization $\vec{P}=\alpha\vec{E}$. The results in this analysis thus extend to polarizable particles.

A paraxial, many-cycle electromagnetic pulse can be modeled using the vector potential ansatz $$\vec{A} = \text{Re}\left\{\vec{A}e^{i\psi}g\left(\frac{\xi}{\xi_0}\right)\right\}, \quad (6)$$

where each component of $\vec{A}$ is a solution of the paraxial wave equation, $g(\cdot)$ is a real even function describing the pulse shape such that $$\lim_{|\xi|\to\infty} g(\xi) \to 0,$$

$\xi_0$ is a constant associated with pulse duration, $\xi \equiv \omega t - k(z-z_i)$ and $\psi \equiv \xi + \psi_0$, with $z_i$ is the pulse's initial position (at t=0) and $\psi_0$ is a phase constant. x, y and z are Cartesian coordinates. $\vec{A}$ is a slowly-varying function of only spatial coordinates such that $\partial_x \vec{A}, \partial_y \vec{A} = O(\epsilon_d)$ and $\partial_z \vec{A} = O(\epsilon_d^2)$, where the beam divergence angle $\epsilon_d \ll 1$. To facilitate the interactions of the particle bunch with the electromagnetic pulse when the bunch is close to the electromagnetic beam axis (and hence at or near the center of the ponderomotive potential well), pulses with $\epsilon_d \xi_0^{-1} = 1$ are used. The electromagnetic fields are obtained via the identities:

$$\vec{B} = \nabla \times \vec{A} \quad (7)$$

$$\vec{E} = c^2 \nabla \int \nabla \cdot \vec{A} dt - \frac{\partial \vec{A}}{\partial t},$$

in which the Lorenz gauge has been applied.

With a non-zero θ (θ=$θ_t$ or $θ_l$) and a particle propagating in the +z direction with speed $|\vec{v}| \equiv \beta c$, all variables in the native frame of the electromagnetic pulse are denoted with prime superscripts, so the pulse propagates in the +z' direction. Variables in the particle's rest frame are denoted with double-prime superscripts. Non-primed variables x, y, z, t are lab frame variables. Under this convention, variables in equations (3)-(5) are double-primed, and those in equation (6) are primed. In particular, since ω in equation (4) denotes the rest frame frequency, it is replaced by the Doppler-shifted frequency ω"≡ωγ(1−β cos θ). Applying the appropriate rotation and Lorentz transformation operators to equations (6) and (7), the ponderomotive potential in the rest frame can be obtained as $$U''_p = \frac{q^2}{4m_0}(|\tilde{A}'_x|^2 + |\tilde{A}'_y|^2)g^2[1 + O(\varepsilon_d) + O(\xi_0^{-1}) + O(\beta)], \quad (8)$$

a result that applies for general $\tilde{\vec{A}}'$ satisfying the paraxial wave equation, assuming that $\tilde{A}'_z$ is on the order of the transverse components or less.

For the linearly-polarized Hermite Gaussian TEM$_{mn}$ mode, $$\vec{\tilde{A}}' \equiv \hat{x}' A_0 f' \exp(-f' \rho'^2) H_m(|f'|\tilde{x}') H_n(|f'|\tilde{y}') \left(\frac{f'}{f'^*}\right)^{\frac{m+n}{2}}, \quad (9)$$

where $A_0$ is a normalization constant, $f' \equiv i/(i+z'/z_0)$, $\tilde{x}' \equiv \sqrt{2}x'/w_0$, $\tilde{y}' \equiv \sqrt{2}y'/w_0$, $z_0 \equiv \pi w_0^2/\lambda$ is the Rayleigh range, $w_0$ is the beam waist radius, $\rho' \equiv \sqrt{x'^2+y'^2}/w_0$, and $H_m(\cdot)$ is the Hermite polynomial of order m ($H_0(x)=1$, $H_1(x)=2x$ etc.), with m,n $\in N_0$ (the set of natural numbers including 0). The beam divergence angle is $\epsilon_d \equiv 2/(kw_0)$. From equations (6) and (7), the peak power P transported in the propagation direction is $$P = \iint S_{z0}' dx' dy' \approx \omega^2 A_0^2 c \epsilon_0 \pi w_0^2 2^{n+m-1} n! m!, \quad (10)$$

where $S_{z0}'$ denotes the z-directed Poynting vector $S_z' \equiv \vec{E}' \times \vec{H}' \cdot \hat{z}'$ evaluated at the pulse peak, focal plane, and carrier amplitude. $\epsilon_0$ is the permittivity of free space. The energy U of a single pulse is related to its peak power as $$U \equiv \iiint S_z'|_{z'=0} dx' dy' dt' \approx \frac{P}{2} \int g^2\left(\frac{\xi'}{\xi_0}\right) d\left(\frac{\xi'}{\omega}\right). \quad (11)$$

Longitudinal compression can be achieved with the TEM$_{mn}$ mode when m is odd and n is even. In that case, $$U''_{pl} = \frac{m_0 K_l}{2}\left[\int g^2\left(\frac{\xi'}{\xi_0}\right) d\left(\frac{\xi'}{\omega}\right)\right]^{-1} x'^2 g^2\left(\frac{\xi'}{\xi_0}\right) \quad (12)$$

$$[1 + O(\xi_0^{-1}) + O((n+m+1)\varepsilon_d^2) + O(\beta)], \text{ where}$$

$$K_l \equiv \frac{q^2\lambda^2}{\pi^3 m_0^2 \varepsilon_0 c^3} \frac{U}{w_0^4} \frac{m!n!}{2^{m+2-2}[(m-1)/2]!^2(n/2)!^2}, \quad (13)$$

and Taylor expansions are applied about the origin in equation (8) to obtain equation (12). The net impulse in the rest frame is then $$\Delta \vec{p}''_t = -\int \nabla'' U''_p dt'' = \quad (14)$$

$$m_0 K_l \frac{[\gamma(\beta - \cos\theta)\Delta x'' + \sin\theta \Delta z'']}{\gamma^2 (1-\beta\cos\theta)^3}\left[\hat{x}(\cos\theta - \beta) - \hat{z}\frac{\sin\theta}{\gamma}\right]$$

$$[1 + O(\xi_0^{-1}) + O((n+m+1)\varepsilon_d^2) + O(\beta)],$$

where the particle's rest frame displacement from the bunch centroid is ($\Delta x''$, $\Delta y''$, $\Delta z''$), which is assumed not to change significantly during the interaction. To eliminate the x-directed modulation and the $\Delta x''$-dependence of the z-directed modulation in the lowest-order term, θ can be chosen such that cos θ=β, a condition equivalent to equation (1). The lab-frame velocity change is then $$\Delta \vec{v}_l = -\hat{z} K_l \Delta z [1 + O(\xi_0^{-1}) + O((n+m+1)\varepsilon_d^2) + O(\beta)], \quad (15)$$

where the particle's lab frame displacement from the bunch centroid is ($\Delta x$, $\Delta y$, $\Delta z$). The longitudinal impulse in the lab frame follows from the relation $\Delta \vec{p}_l = m_0 \gamma^3 \Delta \vec{v}_l + O(\Delta v_l^2)$. The linear dependence in the lowest-order term of equation (15) can correspond to a parabolic potential profile. In the absence of space-charge and momentum spread, a particle pulse can be compressed by a perfectly parabolic potential to a zero extent.

Transverse compression is achieved with the TEM$_{nm}$ mode when m is even and n is odd. In this case, $$U''_{pt} = \frac{m_0 K_t}{2}\left[\int g^2\left(\frac{\xi'}{\xi_0}\right) dt'\right]^{-1} y'^2 g^2\left(\frac{\xi'}{\xi_0}\right) \quad (16)$$

$$[1 + O(\xi_0^{-1}) + O((n+m+1)\varepsilon_d^2) + O(\beta)], \text{ where}$$

$$K_t \equiv \frac{q^2\lambda^2}{\pi^3 m_0^2 \varepsilon_0 c^3} \frac{U}{w_0^4} \frac{m!n!}{2^{m+n-2}[(n-1)/2]!^2(n/2)!^2}. \quad (17)$$

The net transverse impulse imparted by the passage of a single pulse in the rest frame is $$\Delta \vec{p}''_t = m_0 K_t \frac{1}{\gamma(1-\beta\cos\theta)} \Delta y'' \hat{y} \quad (18)$$

$$[1 + O(\xi_0^{-1}) + O((n+m+1)\varepsilon_d^2) + O(\beta)],$$

corresponding to a net lab-frame velocity change of $$\Delta \vec{v}_t = -\hat{y} K_t \frac{1}{\gamma^2(1-\beta\cos\theta)} \Delta y \quad (19)$$

$$[1 + O(\xi_0^{-1}) + O((n+m+1)\varepsilon_d^2) + O(\beta)].$$

As θ approaches 0°, the velocity change can become larger a result of improved group velocity matching along the optical beam axis. The transverse impulse in the lab frame follows from the relation $\Delta \vec{p}_t = m_0 \gamma \Delta \vec{v}_t + O(\Delta v_t^2)$. Several noteworthy features of the pulse compression scheme are evident from (13), (15), (17) and (19):

1) At the lowest order, the net velocity change can be independent of pulse duration parameter $\xi_0$ and pulse shape g;
2) A trade-off between size of the parabolic potential region and strength of the compression can exist in two ways: through the laser waist radius $w_0$, and through the choice of m and n. One solution to achieving a large parabolic potential region and a large Δv for a given total optical energy may lie in the superposition of higher-order Hermite-Gaussian modes; and 3) $\Delta v \propto \lambda^2$, suggesting that greater net impulse may be achieved via longer-wavelength sources. However, that increasing the wavelength may increase the pulse duration for the same number of temporal cycles, which may weaken the assumption that the particle's position relative to the intensity well does not change significantly during the interaction.

The focal time (the time of maximal compression) of an electron pulse with an initial velocity chirp can be estimated with the formula $$t_f = \frac{\Delta r_0}{|v_T|}, \quad (20)$$

where $\Delta r_0$ is the half-width of the electron pulse in the dimension of compression immediately before the interaction, and $v_T \equiv \Delta v + v_0$, $v_0$ and $\Delta v$ being respectively the initial velocity of and the velocity change imparted to a particle at the edge of the bunch along the dimension of compression, immediately before the interaction.

Numerical Analysis of Particle Pulse Compression

Numerical modeling of the laser-electron interaction can be achieved by solving the exact Newton-Lorentz equation using an adaptive-step fifth-order Runge-Kutta algorithm. The coordinates of each particle are assigned in a quasi-random fashion using Halton sequences. For the laser pulses, first-order Hermite-Gaussian modes, which are exact (i.e., non-paraxial) solutions of Maxwell's equations in free space, are employed. The fields of a $TEM_{10}$ mode with a Poisson spectrum by choosing the Hertz vector potential can be obtained as:

$$\vec{\Pi}_{10} = \frac{\partial}{\partial x} \vec{\Pi}_{00} \quad (21)$$

in the relations:

$$\vec{B} = \text{Re}\left\{\frac{1}{c^2} \frac{\partial}{\partial t} \nabla \times \vec{\Pi}_{10}\right\} \quad (22)$$

$$\vec{E} = \text{Re}\{\nabla \times \nabla \times \vec{\Pi}_{10}\},$$

where the vector potential corresponding to a fundamental Gaussian mode is:

$$\vec{\Pi}_{00} = \hat{x} \Pi_0 \frac{1}{R'} (f_+^{-s-1} - f_-^{-s-1}). \quad (23)$$

In (21), $f_\pm = 1 - (i/s)(\omega t \pm kR' + ika)$, $R' = [x^2 + y^2 + (z+ia)^2]^{1/2}$, and $\Pi_0$ is a complex constant. The degree of focusing and the pulse duration can be controlled through parameters a and s via relations for which good analytical approximations have been derived. The non-paraxial Gaussian beam amy reduces to the phasor of the paraxial Gaussian beam in the paraxial limit, so the description (21)-(23) is consistent with (6)-(9).

Unless otherwise specified, all numerical simulations use optical pulses of wavelength $\lambda = 0.8$ μm, waist radius $w_0 = 180$ μm, and (intensity) full-width-half-maximum (FWHM) pulse duration $\tau = 50$ fs. Each optical pulse in the longitudinal compression stage has an energy of 17.5 mJ, whereas each pulse in the transverse compression stage has an energy of about 26 mJ. These specifications fall well within the range that can be experimentally achievable. The initial 30 keV electron pulse is a zero-emittance, uniformly-filled ellipsoid of diameter 28 μm and length 14 μm, corresponding to a FWHM electron pulse duration of 100 fs. The particles are non-interacting and the simulation results are thus applicable to single-electron pulses.

Figure 8A:
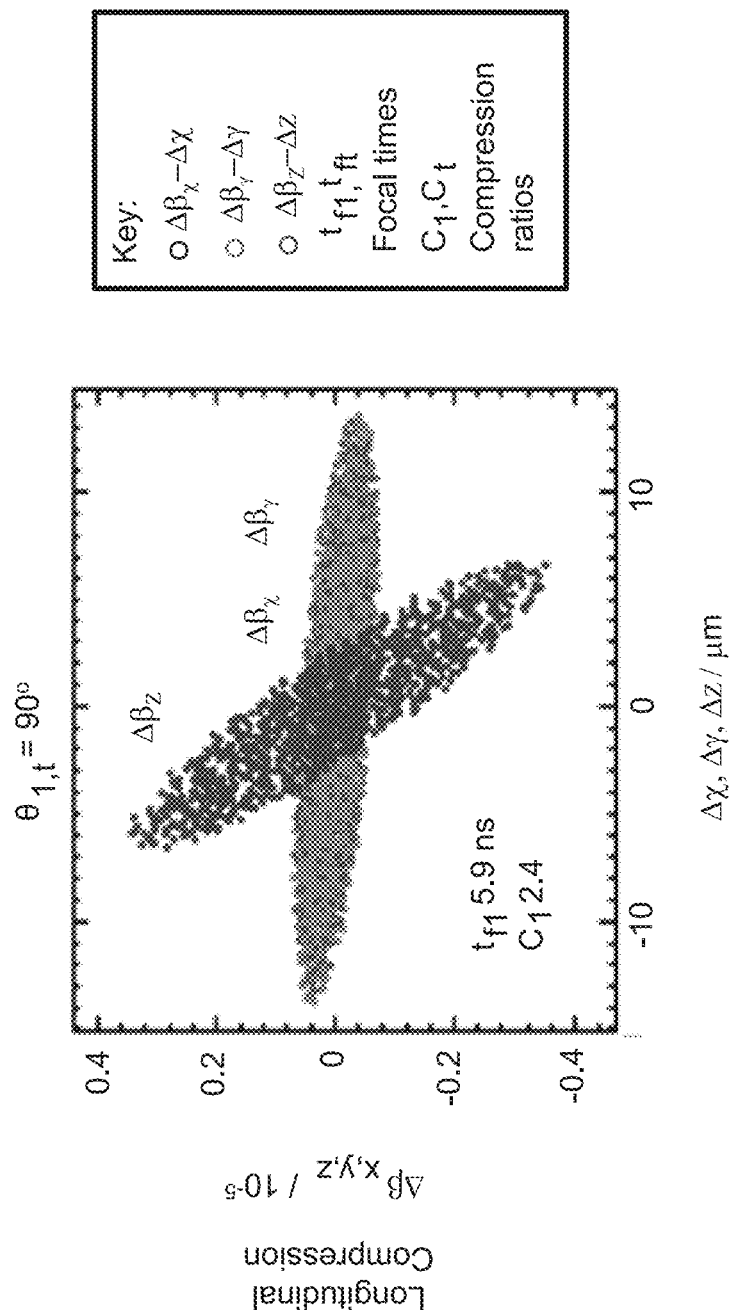
FIGS. 8A-8F show phase plane distributions of an electron pulse immediately after the longitudinal compressions.
Figure 8B:
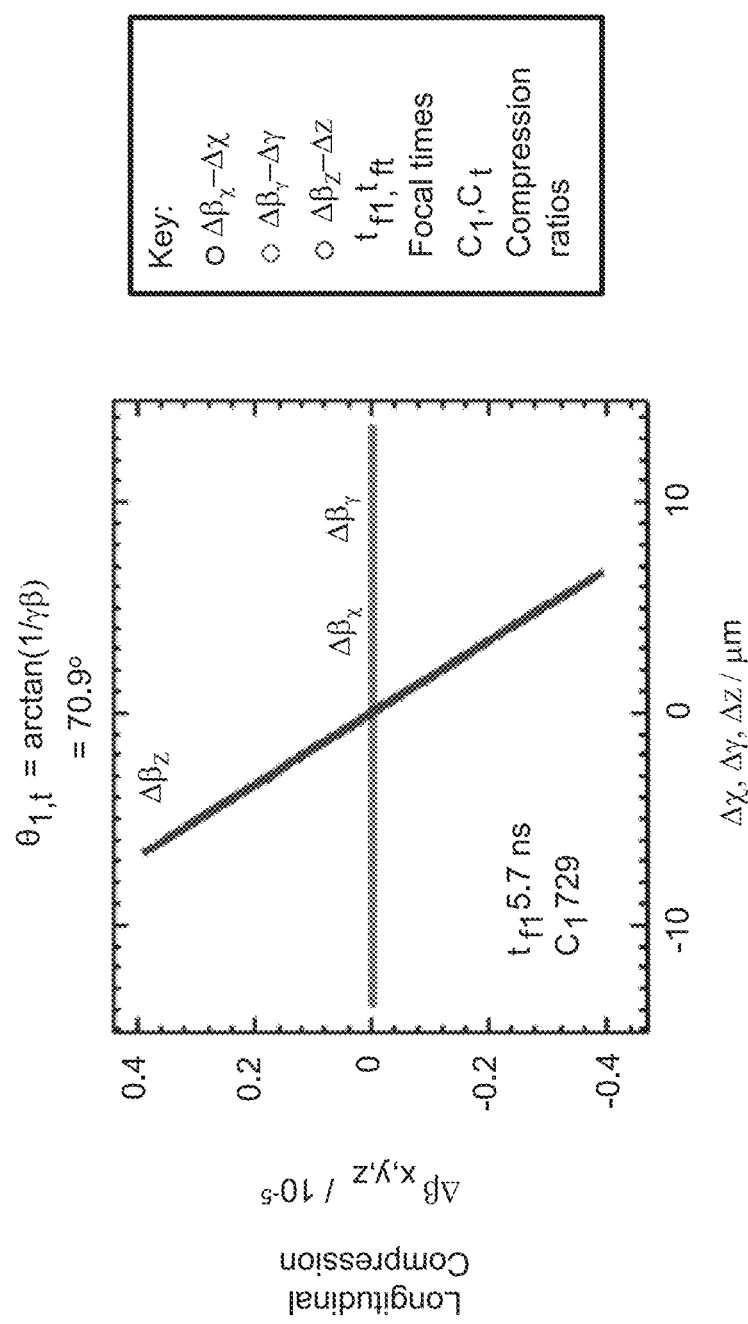
Figure 8C:
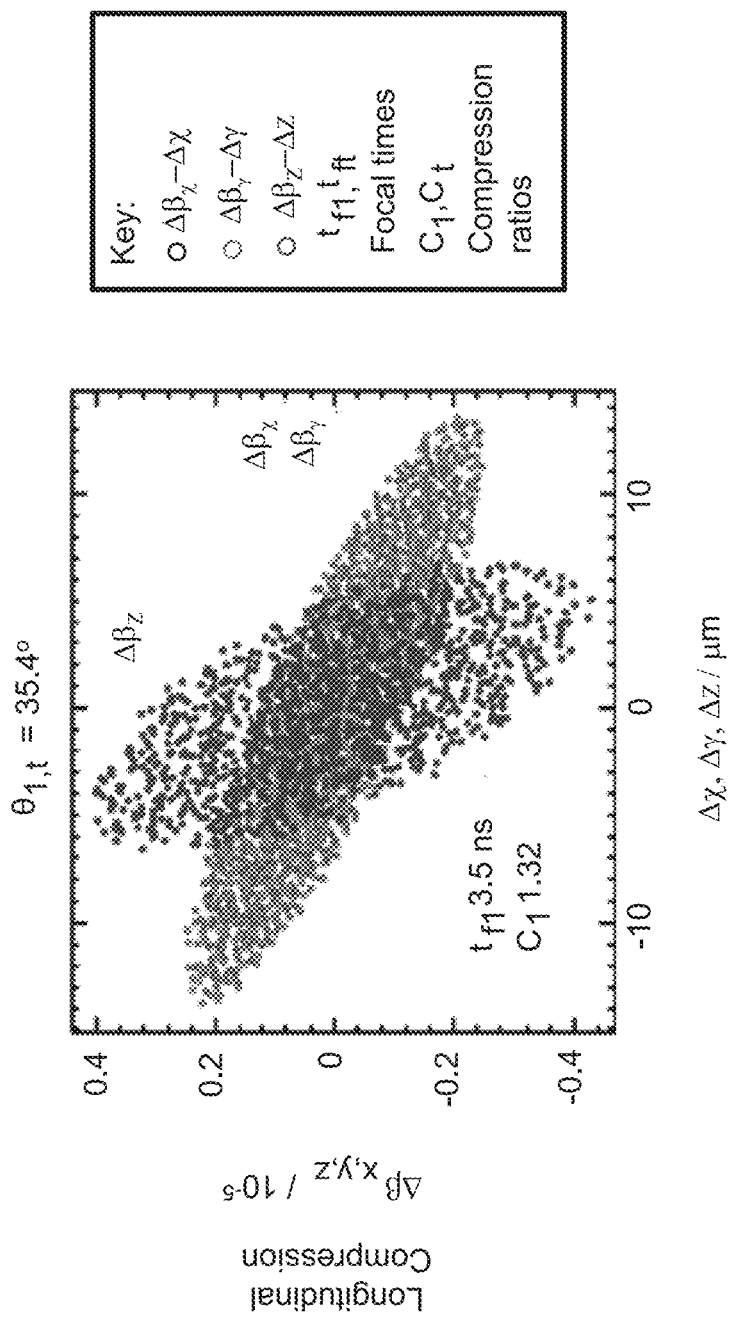

FIGS. 8A-8C depict the numerically-computed phase space distributions of electron pulses immediately after the longitudinal compression stage, for various optical incidence angles $\theta_l$. The longitudinal magnification $M_l$ is defined as $M_l \equiv \sigma_z(t_{fl})\sigma_z(0)$, where $\sigma_z = \sigma_z(t)$ is the standard deviation in z at time t. Here, t=0 is defined as the instant captured in FIG. 8A and $t = t_{fl}$ the instant when the longitudinal focus is achieved: namely, when $M_l$ is minimized. The transverse magnification at the longitudinal focus is $M_{tl} \equiv \sigma_x(t_{fl})/\sigma_x(0)$, where a $\sigma_x = \sigma_x(t)$ is the standard deviation in x at time t.

In FIG. 8A, two effects can be observed in the situation of normal optical incidence in the lab frame, both of which are analytically described in equation (14). The first effect is the modulation in the transverse phase planes, and the second effect is the substantial smear in the $\Delta\beta_z-\Delta z$ phase plane, resulting in a large longitudinal emittance and consequently a weak longitudinal compression factor $C_l \equiv M_l^{-1}$. The smeared particle distributions can be largely due to walk-off between the center of the ponderomotive potential well and the center of the electron pulse, whereas the presence of transverse modulation can be largely due to a tilted angle of optical incidence in the rest frame of the electron pulse. The sensitivity of the longitudinal compression to the optical incidence angle is illustrated in FIG. 9A.

Note that the smearing and transverse modulation exist although the optical pulse duration $\tau = 50$ fs is several tens of times smaller than $w_0/v$ (where $w_0(v\tau)^{-1} \approx 36 \gg 1$) and so nominally satisfies the thin lens approximation condition for normal incidence. This suggests that the thin lens approximation condition alone may not be sufficient for effective longitudinal compression when the kinetic energy is on the order of 30 keV or greater.

Injecting the optical pulse at an oblique angle according to equation (1) can decouple the longitudinal modulation from the transverse modulation at the lowest order and significantly improve the compression factor from the normal incidence case in FIG. 8A. This is shown in FIG. 8B, where a compression factor of $C_l = 729$ is achieved, taking the 100 fs electron pulse well into the attosecond regime. Further decreasing the incidence angle, as shown in FIG. 8C, gives rise again to the substantial smearing of particle distributions in the $\Delta\beta_z-\Delta z$ phase plane, as well as modulations in the transverse phase planes.

The area occupied in a 2-dimensional phase plane may not be conserved in the interaction due to inter-dimensional coupling caused by a non-zero magnetic field. This does not violate Liouville's theorem, which states that the 6-dimensional phase space volume is conserved in a Hamiltonian system. The electron pulse is also affected equally in the $\Delta\beta_x-\Delta x$ and $\Delta\beta_y-\Delta y$ phase planes due to the use of both electromagnetic pulses 120 and 130 in FIG. 1A, instead of attempting the longitudinal compression with only one of them.

Figure 8D:
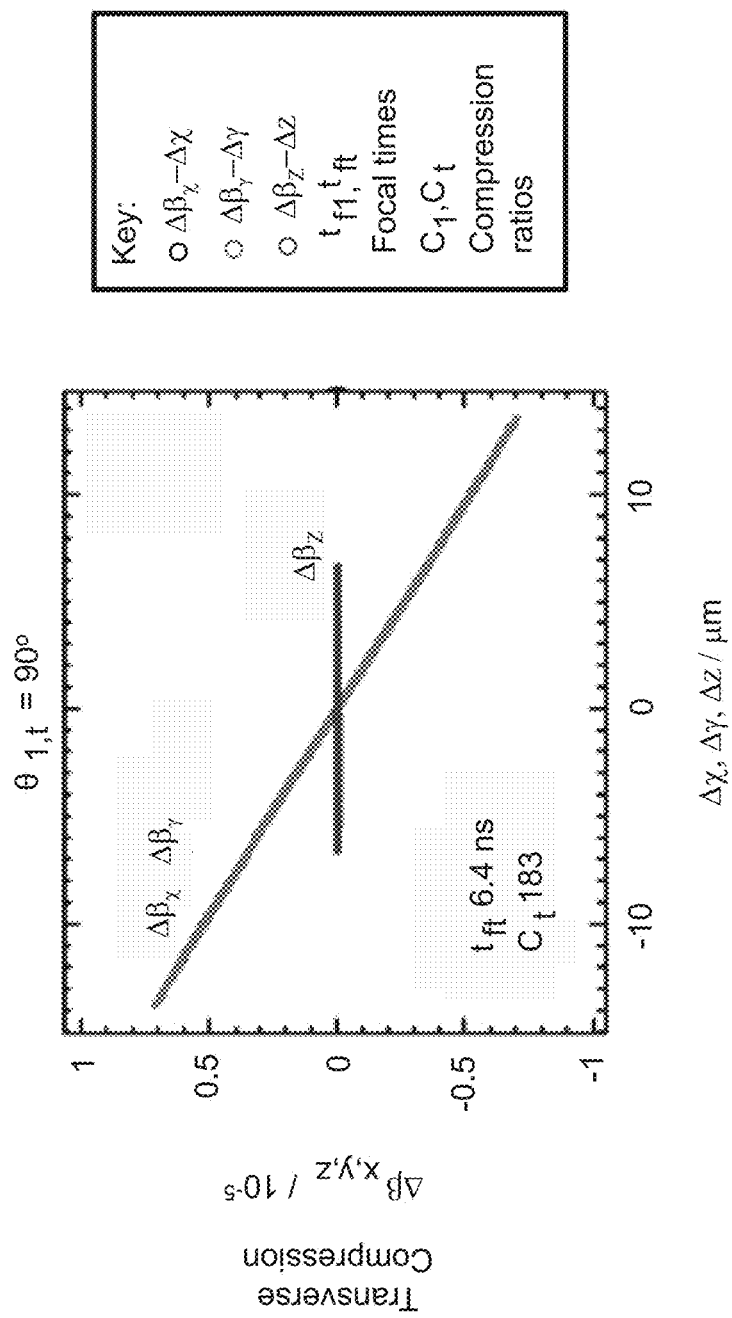
Figure 8E:
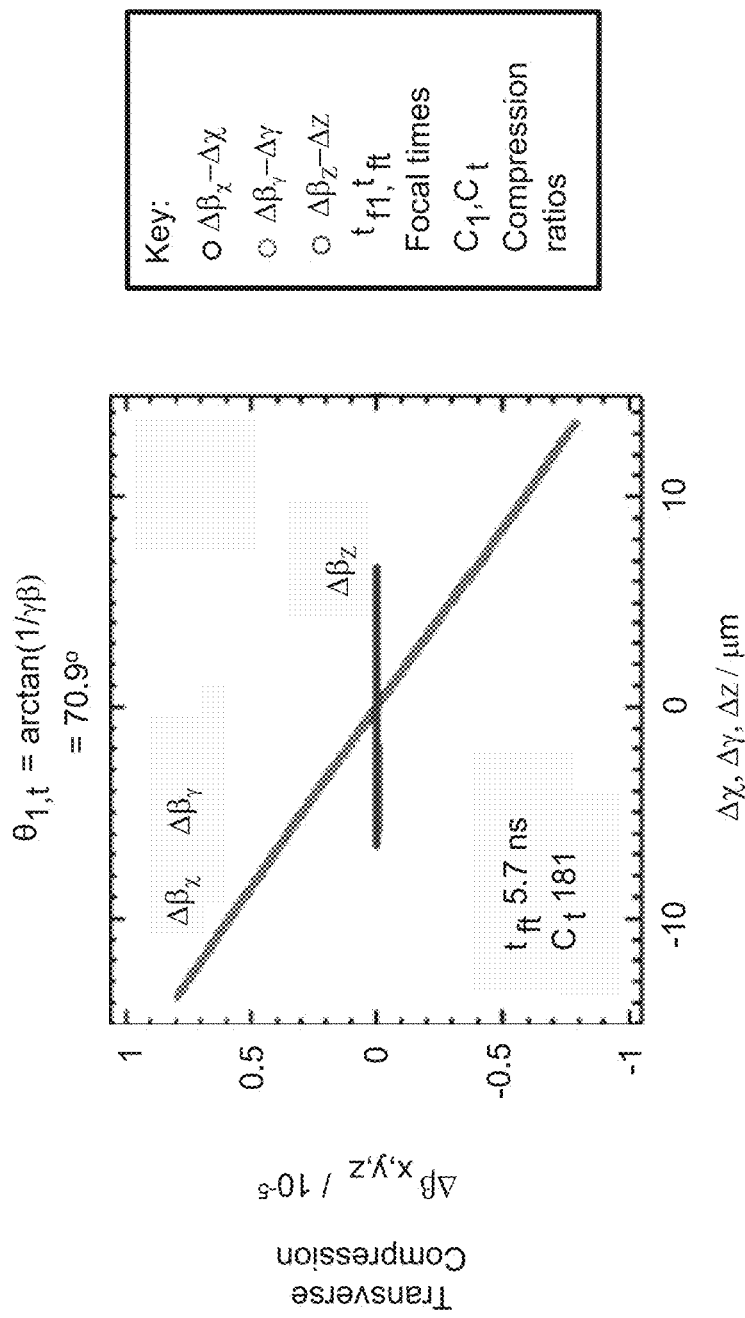
Figure 8F:
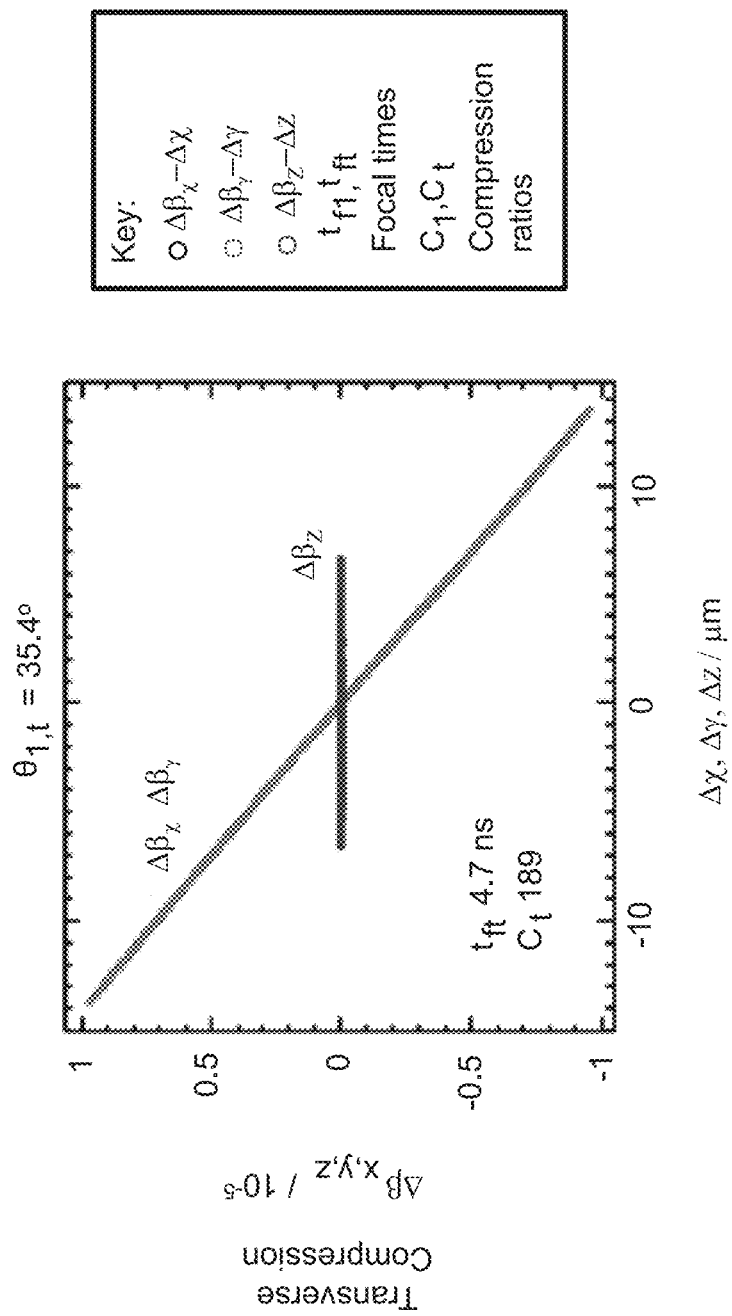

FIGS. 8D-8F depict the numerically-computed phase space distributions of electron pulses immediately after the transverse compression stage for various optical incidence angles $\theta_t$. The transverse magnification is defined as $M_t \equiv \sigma_x(t_{ft})/\sigma_x(0)$, where $t_{ft}$ is the time at which $M_t$ is minimal. The longitudinal magnification at the transverse focus is $M_{lt}=\sigma_z(t_{ft})/\sigma_z(0)$. Because the configuration in FIG. 1A can subject the electron pulse to similar treatments in x and y at the lowest order, $\sigma_y$ can behave essentially in the same way as $\sigma_x$. The increase in $\Delta\beta_{x,y}$ (and subsequent decrease in $t_{ft}$) as $\theta_t$ increases is as analytically described in equation (19). Although the transverse compression ratio can be a relatively weak function of $\theta_t$, FIG. 8B shows that the choice of $\theta_t$ can significantly affect the longitudinal compression ratio in a three-dimensional compression scheme via the effect of higher-order terms, with maximum longitudinal compression achieved with $\theta=0°$.

With the simulation parameters of FIG. 8B, the lowest-order term of equation (15) can yield $\Delta v_f \approx 3.925 \times 10^{-6}$ c at $\Delta z=-6.627$ μm (actual computed value $\Delta\beta_z=3.894\times10^{-6}$, relative error 0.80%). For the transverse compression cases, the lowest-order term of (19) can yield $\Delta v_f \approx 3.671\times10^{-6}$ c at $\Delta x=-6.945$ μm for FIG. 8D (actual value $\Delta\beta_x=3.644\times10^{-6}$, relative error 0.74%); $\Delta v_f \approx 4.113\times10^{-6}$ c at $\Delta x=-6.944$ μm for FIG. 8E (actual value $\Delta\beta_x=4.081\times10^{-6}$, relative error 0.78%); and $\Delta v_f \approx 5.010\times10^{-6}$ c at $\Delta x=-6.943$ μm for FIG. 8F (actual value $\Delta\beta_x=4.974\times10^{-6}$, relative error 0.72%). These examples demonstrate the accuracy of (15) and (19) in estimating the velocity chirp induced by the interaction.

Figure 10A:
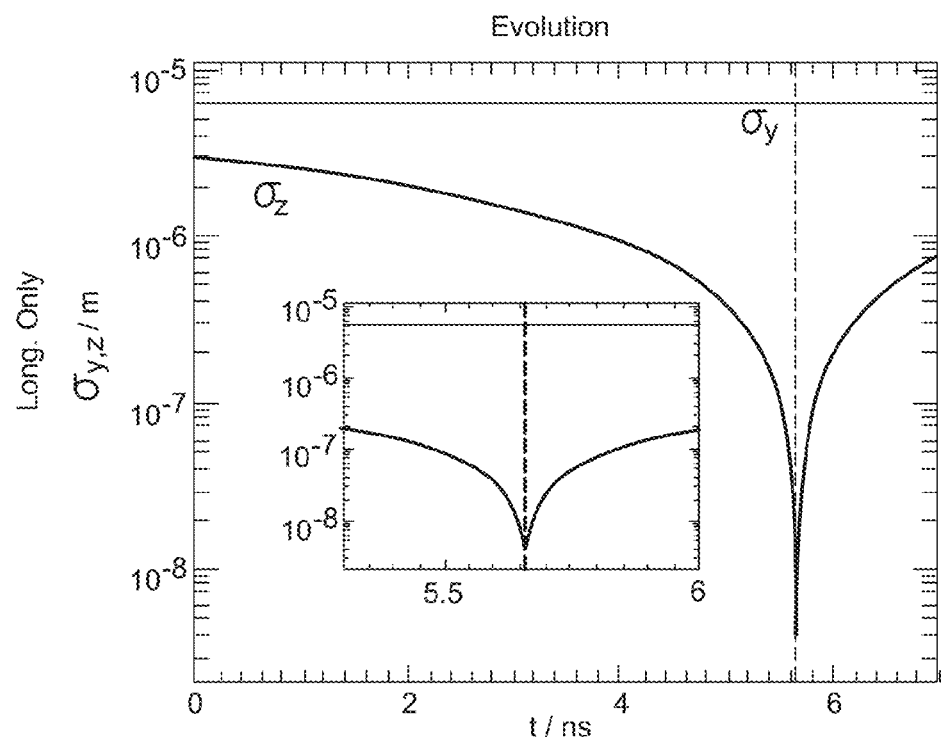

The negative velocity chirp in FIG. 8B can cause the 30 keV electron pulse to compress in the longitudinal dimension as the electron pulse continues propagating after the interaction. FIG. 8A shows the evolution of the electron pulse's transverse and longitudinal standard deviations with time. The transverse spread remains practically unchanged from its initial value, even as the 100 fs electron pulse is compressed longitudinally into the attosecond regime ($C_1=729$). The electron pulse distribution at the longitudinal focus, marked by a vertical dotted line in FIG. 10A, is shown in FIGS. 10B-10C. The higher-order non-linear components of the induced velocity chirp prevents the ellipsoid from collapsing into a perfectly flat pancake.

Figure 10D:
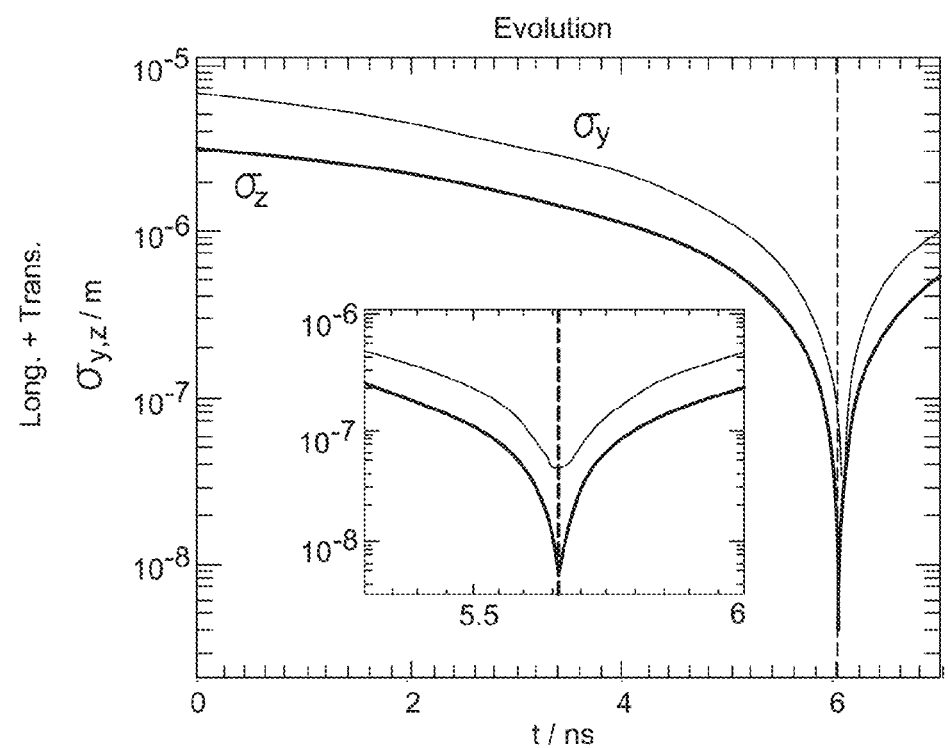
Figure 10B:
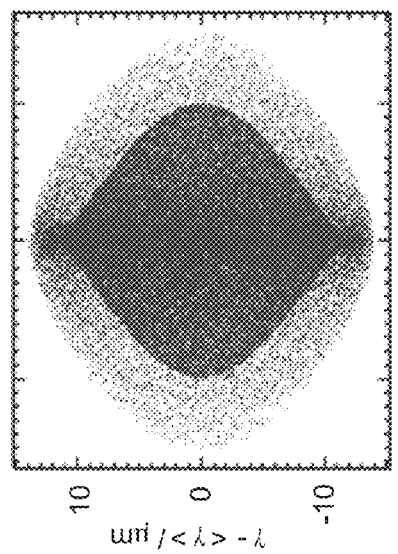
Figure 10C:
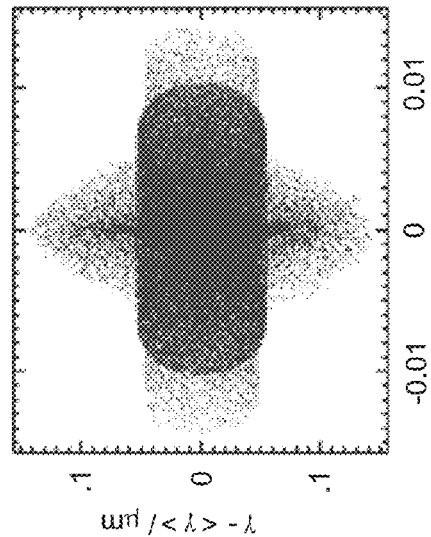
Figure 10E:
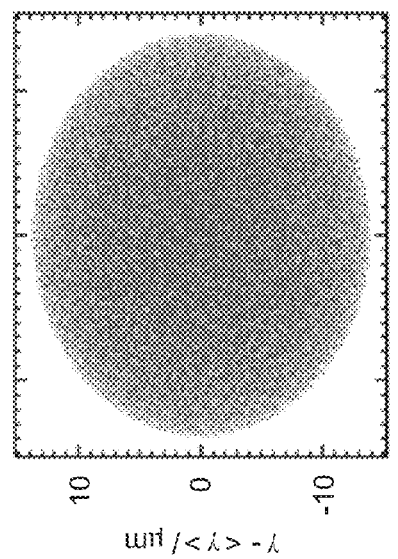
Figure 10F:
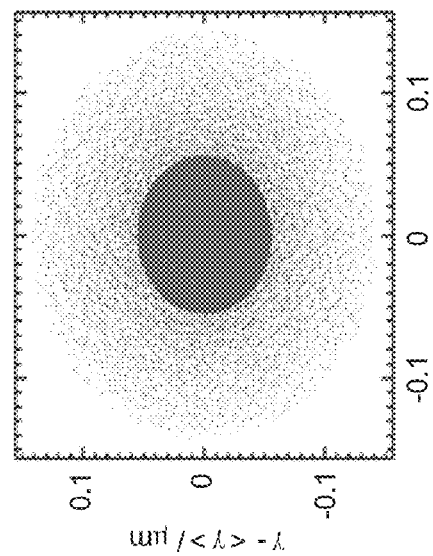

FIGS. 10D-10F depict the three-dimensional compression of a 30 keV electron pulse from a duration of 100 fs and a diameter of 28 mm to a duration of 137 as and a diameter of 0.153 μm ($C_1=729$, $C_t=183$). $\theta_t$ satisfies equation (1) and $\theta_t=0°$. Simultaneous transverse and longitudinal compression can be achieved without affecting the longitudinal compression ratio of the purely-longitudinal-compression scheme in FIG. 10A.

Figure 11A:
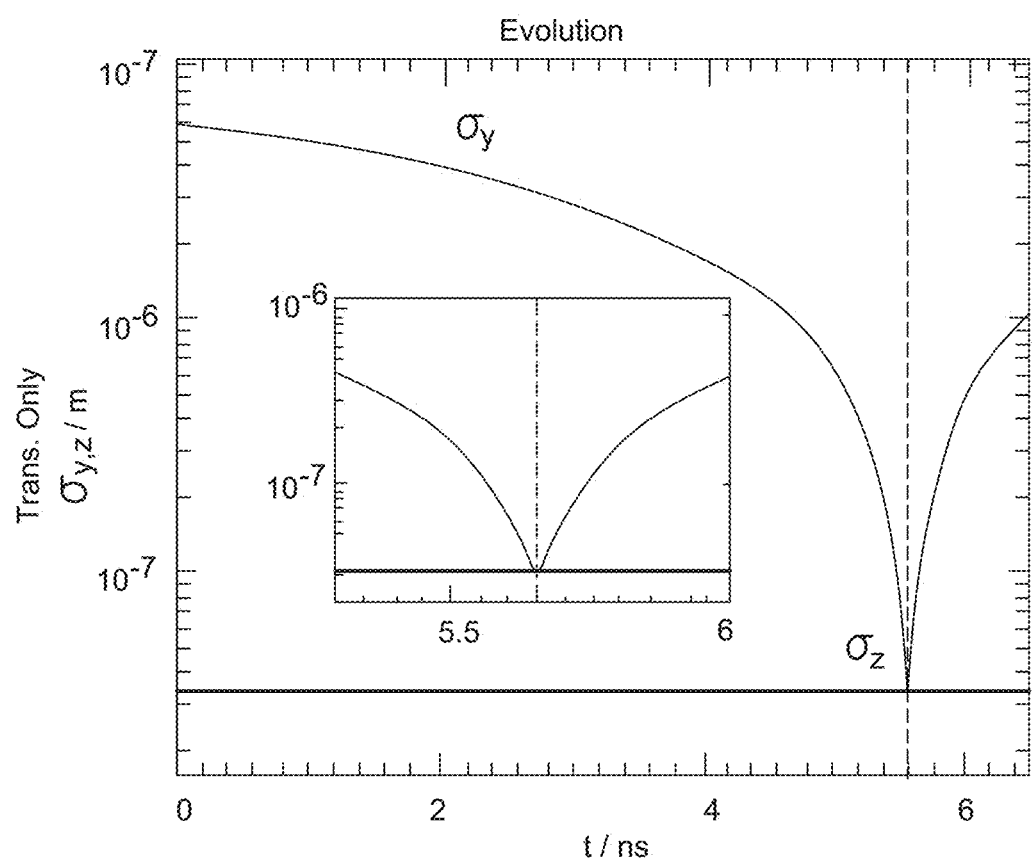
FIGS. 11A-11C show transverse compression of a 30 keV, 1 fs-long electron pulse from a diameter of 28 μm to an effective diameter of 0.156 μm.
Figure 11C:
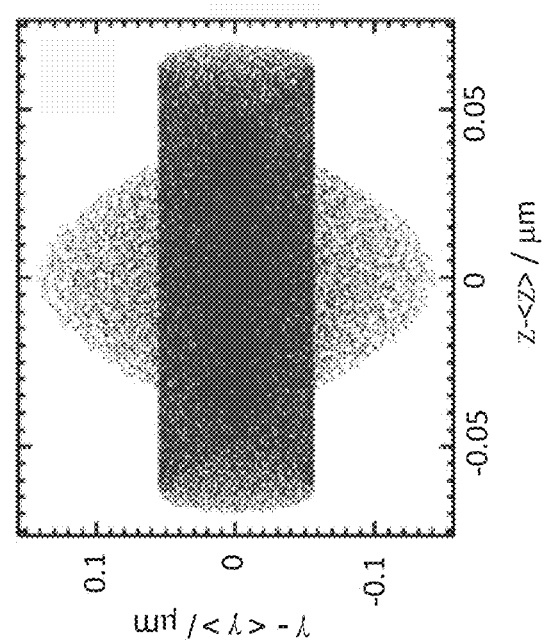
Figure 11B:
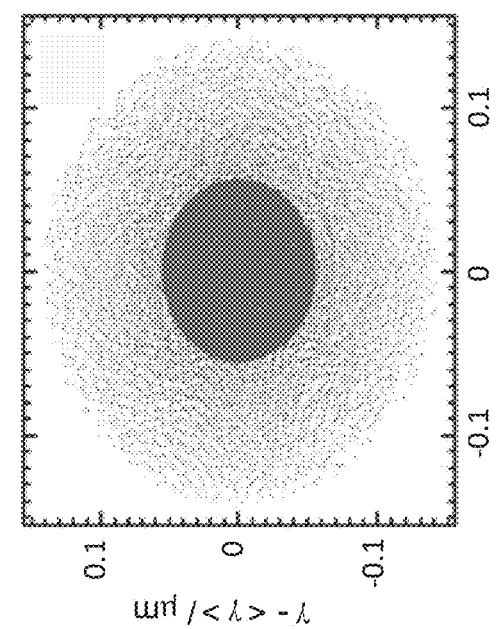

FIGS. 11A-11C depict the transverse compression of a 30 keV electron pulse of diameter 28 mm and pulse duration 1 fs by a factor of $C_t=179$. $\theta_t=0°$ here. In FIG. 11A, the longitudinal spread remains practically unchanged from its initial value even as the electron pulse is focused transversely. This demonstrates the ability to focus ultrashort electron pulses without inducing the temporal resolution-limiting distortions these ultrashort electron pulses tend to suffer from when being focused by magnetic lenses.

The $Uw_0^{-4}$ dependence in equations (13) and (17) implies that significant energy savings can be achieved by decreasing the beam waist, for a given initial electron pulse and focal time. Decreasing the beam waist, however, may induce or enhance higher-order distortions that can limit the maximum achievable compression. FIGS. 12A-12D illustrate a tradeoff between compression factor and pulse energy when $Uw_0^{-4}$ is kept constant at its value in FIGS. 8A-8F and FIGS. 9A-9B, for the initial electron pulse used in those figures. That the magnification scales as $w_0^{-2}$ is consistent with the fact that the dominant higher-order distortions scale as $O(\epsilon_d^2)$ in equations (15) and (19).

Figure 12A:
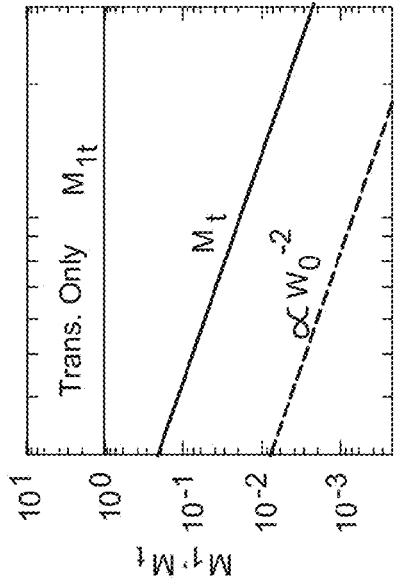
FIGS. 12A-12D show scaling of magnification with optical beam waist for the optical pulses and initial electron pulses used in FIGS. 8-9.
Figure 12B:
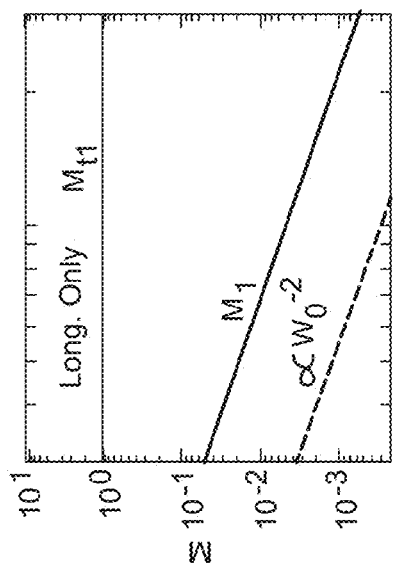
Figure 12C:
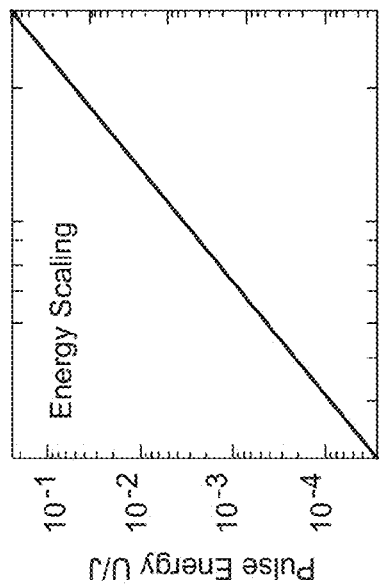
Figure 12D:
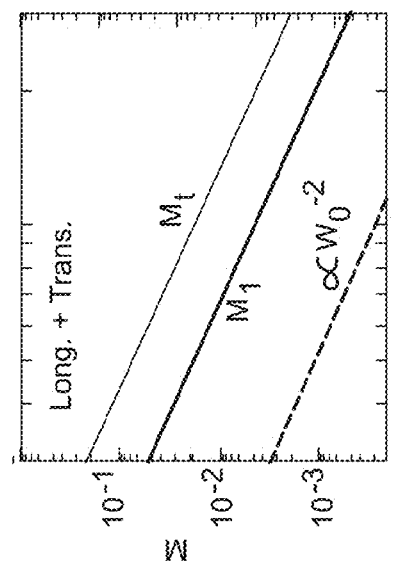

In FIGS. 12A-12D, U refers to the total energy used in the longitudinal compression stage. Since $\theta_t=0°$, the energy used for compression in each transverse dimension is typically smaller by a factor of about $(1+\beta)$, in accordance with equation (19), so that the longitudinal and transverse foci coincide in the three-dimensional compression scheme. The plots in FIGS. 12A-12D show that decent compression factors are already attainable with relatively low-energy optical pulses. In FIG. 12A, for instance, a longitudinal compression factor of 20 is already achievable with optical pulses of waist radius 30 mm and total energy 27 mJ.

Although single-electron pulses are used in this example analysis, the present techniques can be used for multi-electron pulse compression. This can be especially (but not only) true when the electron pulse approximates a uniformly-filled ellipsoid or contains a linear velocity chirp. Typical multi-electron pulses normally have much larger diameters—which can be on the order of a few hundreds of μm—than the electron pulses considered in this example analysis. Therefore, more energetic optical pulses may be employed to achieve the same compression quality and focal times.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method for modulating a particle pulse, the method comprising:
   A) propagating the particle pulse at a velocity v along a first direction, the particle pulse comprising at least one of a plurality of charged particles or a plurality of polarizable neutral particles;
   B) propagating a first electromagnetic pulse along a second direction at a first oblique angle $\theta_1$ with respect to the first direction in a laboratory frame of reference so as to cause the first electromagnetic pulse to at least partially overlap with the particle pulse; and
   C) propagating a second electromagnetic pulse along a third direction at a second oblique angle $\theta_2$ with respect to the first direction in the laboratory frame of reference so as to cause the second electromagnetic pulse to at least partially overlap with the particle pulse,
   wherein the second oblique angle $\theta_2$ is based at least in part on the first oblique angle $\theta_1$.

2. The method of claim 1, wherein the second electromagnetic pulse propagates in a plane defined by the first direction and the second direction.

3. The method of claim 1, wherein the second oblique angle $\theta_2$ is substantially equal to minus $\theta_1$.

4. The method of claim 3, further comprising:
   changing the first oblique angle $\theta_1$ so as to control a ratio of transverse impulse to longitudinal impulse on the particle pulse.

5. The method of claim 1 at least one of the first electromagnetic pulse or the second electromagnetic pulse comprises a Hermite-Gaussian mode of an order greater than zero.

6. The method of claim 1, wherein at least one of the first electromagnetic pulse or the second electromagnetic pulse comprises at least one of a Laguerre-Gaussian mode, an Ince-Gaussian mode, a Bessel-Gaussian mode, or a Hypergeometric-Gaussian mode.

7. The method of claim 1, wherein each of the first electromagnetic pulse and the second electromagnetic pulse has an intensity profile with a local minimum along at least one line passing through a center of respective electromagnetic pulse.

8. The method of claim 7, wherein B) comprises propagating the particle pulse in a central region including the local minimum of the intensity profile so as to compress the particle pulse in the first direction.

9. The method of claim 7, wherein B) comprises propagating the particle pulse in a sloped region of the intensity profile behind the local minimum in the first direction so as to accelerate the particle pulse.

10. The method of claim 7, wherein B) comprises propagating the particle pulse in a sloped region of the intensity profile before the local minimum in the first direction so as to decelerate the particle pulse.

11. The method of claim 1, further comprising:
    propagating a third electromagnetic pulse substantially along the first direction so as to compress the particle pulse in a direction orthogonal to the first direction.

12. The method of claim 1, further comprising:
    generating at least one of the first electromagnetic pulse or the second electromagnetic pulse by combining a plurality of Hermite-Gaussian modes of order greater than one.

13. The method of claim 1, further comprising:
    generating at least one of the first electromagnetic pulse or the second electromagnetic pulse by propagating a first half of a fundamental Gaussian pulse through a half waveplate.

14. The method of claim 1, further comprising:
    generating the particle pulse using a radio frequency (RF) electron gun.

15. An apparatus for providing a modulated particle pulse, the apparatus comprising:
    a particle source to provide a particle pulse propagating at a velocity v along a first direction, the particle pulse comprising at least one of a plurality of charged particles or a plurality of polarizable neutral particles;
    at least one light source to provide a first electromagnetic pulse and a second electromagnetic pulse; and
    at least one beam steering optic, in optical communication with the at least one light source, to direct the first electromagnetic pulse along a second direction at a first oblique angle $\theta_1$ with respect to the first direction in a laboratory frame of reference so as to cause the first electromagnetic pulse to at least partially overlap with the particle pulse, the at least one beam steering optic further directing the second electromagnetic pulse along a third direction at a second oblique angle $\theta_2$ with respect to the first direction in the laboratory frame of reference so as to cause the second electromagnetic pulse to at least partially overlap with the particle pulse,
    wherein the second oblique angle $\theta_2$ is based at least in part on the first oblique angle $\theta_1$.

16. The apparatus of claim 15, wherein each of the first electromagnetic pulse and the second electromagnetic pulse has a pulse duration less than 1 ns.

17. The apparatus of claim 15, wherein the at least one light source comprises a laser to provide at least one of the first electromagnetic pulse or the second electromagnetic pulse comprising a laser pulse in a Hermite-Gaussian mode of an order greater than zero.

18. The apparatus of claim 15, wherein the at least one light source comprises:
    a laser to provide a first laser pulse in fundamental Gaussian mode; and
    a half waveplate, in optical communication with the laser, to transmit a first portion of the laser pulse so as to generate at least one of the first electromagnetic pulse or the second electromagnetic pulse comprising a second laser pulse in Hermite-Gaussian mode of an order greater than zero.

19. The apparatus of claim 15, wherein the at least one light source comprises:
   at least one laser to provide a plurality of laser pulses, each laser pulse in the plurality of laser pulses configured to be in a Hermite-Gaussian mode of an order greater than one; and
   at least one beam combining optic, in optical communication with the at least one laser, to generate at least one of the first electromagnetic pulse or the second electromagnetic pulse based at least in part on a superposition of the plurality of laser pulses.

20. The apparatus of claim 15, further comprising a particle accelerator, operably coupled to the particle source, to accelerate the particle pulse to the velocity v.

21. The apparatus of claim 15, wherein the at least one beam steering optic is configured to tune at least one of the first oblique angle $\theta_1$ or the second oblique angle $\theta_2$ with respect to the first direction over a range of about 10° to about 80°.

22. The apparatus of claim 15, each of the first electromagnetic pulse and the second electromagnetic pulse having an intensity profile with a local minimum along at least one line passing through a center of respective electromagnetic pulse.

23. The apparatus of claim 22, wherein the at least one beam steering optic is configured to overlap a central region including the local minimum of the intensity profile with the particle pulse so as to longitudinally compress the particle pulse.

24. The apparatus of claim 22, wherein the at least one beam steering optic is configured to overlap a first region of the intensity profile, behind the local minimum along the first direction, with the particle pulse so as to accelerate the particle pulse.

25. The apparatus of claim 22, wherein the at least one beam steering optic is configured to overlap a second region of the intensity profile, before the local minimum along the first direction, with the particle pulse so as to accelerate the particle pulse.

26. The apparatus of claim 15, further comprising:
   a second light source to provide a third electromagnetic pulse propagating substantially along the first direction so as to compress the particle pulse in a direction orthogonal to the first direction.

27. A method for modulating an electron pulse, the method comprising:
   A) propagating the electron pulse at a velocity v along a first direction;
   B) propagating a first electromagnetic pulse along a second direction at a first oblique angle $\theta_1$ with respect to the first direction in a laboratory frame of reference so as to cause the first electromagnetic pulse to at least partially overlap with the electron pulse; and
   C) propagating a second electromagnetic pulse along a third direction at a second oblique angle $\theta_2$ with respect to the first direction in the laboratory frame of reference so as to cause the second electromagnetic pulse to at least partially overlap with the electron pulse, the second oblique angle $\theta_2$ being substantially equal to minus $\theta_1$; and
   D) changing a magnitude of the first oblique angle $\theta_1$ and the second oblique angle $\theta_2$ so as to control a ratio of transverse impulse to longitudinal impulse on the electron pulse,
   wherein each of the first electromagnetic pulse and the second electromagnetic pulse has an intensity profile with a local minimum along at least one line passing through a center of respective electromagnetic pulse,
   wherein B) comprises propagating the electron pulse in a central region including the local minimum of the intensity profile so as to compress the electron pulse in the first direction.

* * * * *